US012727431B2

(12) United States Patent
Huang et al.

(10) Patent No.: US 12,727,431 B2
(45) Date of Patent: Sep. 1, 2026

(54) OVERHEAD HOIST TRANSFER SYSTEM, OVERHEAD HOIST TRANSFER, MOVING KIT

(71) Applicant: MIRLE AUTOMATION CORPORATION, Hsinchu (TW)

(72) Inventors: Yen-Wen Huang, Hsinchu (TW); Cheng-Yi Huang, Hsinchu (TW); Chuan-Ming Chung, Hsinchu (TW); Cheng-Cheng Lo, Hsinchu (TW)

(73) Assignee: MIRLE AUTOMATION CORPORATION, Hsinchu (TW)

( * ) Notice: Subject to any disclaimer, the term of this patent is extended or adjusted under 35 U.S.C. 154(b) by 853 days.

(21) Appl. No.: 18/098,181

(22) Filed: Jan. 18, 2023

(65) Prior Publication Data

US 2023/0234813 A1 Jul. 27, 2023

Related U.S. Application Data

(60) Provisional application No. 63/302,523, filed on Jan. 24, 2022.

(30) Foreign Application Priority Data

Dec. 28, 2022 (TW) ................................ 111150252

(51) Int. Cl.

*H10P 72/30* (2026.01)
*B66C 9/04* (2006.01)
*B66C 9/06* (2006.01)

(52) U.S. Cl.

CPC ............ *H10P 72/3208* (2026.01); *B66C 9/04* (2013.01); *B66C 9/06* (2013.01); *H10P 72/3218* (2026.01); *H10P 72/3221* (2026.01)

(58) Field of Classification Search

CPC ........... H01L 21/67715; H01L 21/6773; H01L 21/67733; H01L 21/677; H01L 21/67703;

(Continued)

(56) References Cited

U.S. PATENT DOCUMENTS 9,061,839 B2 * 6/2015 Murayama ........ H01L 21/67715
9,758,308 B1 * 9/2017 Nishikawa ........ H01L 21/67715

(Continued)

FOREIGN PATENT DOCUMENTS

CN 1982175 A 6/2007
CN 103159027 A 6/2013

(Continued)

*Primary Examiner* — S. Joseph Morano
*Assistant Examiner* — James William Jones
(74) *Attorney, Agent, or Firm* — Li & Cai Intellectual Property (USA) Office

(57) ABSTRACT

An overhead hoist transfer system and an overhead hoist transfer. The overhead hoist transfer system includes a plurality of lower rails, a plurality of upper rail sets, and a plurality of overhead hoist transfers. The overhead hoist transfer includes a moving kit and a frame. The moving kit includes a control module, a drive wheel set, and a plurality of upper guide wheels. The control module controls the upper guide wheels to move between an upper position and a lower position. Before the overhead hoist transfer makes a turn along the lower rail and the upper rail set, the control module controls the upper guide wheels to move to the upper position or the lower position. When the plurality of upper guide wheels abut against the adjacent upper rail set, the overhead hoist transfer turns along the upper rail set.

19 Claims, 35 Drawing Sheets

(58) Field of Classification Search
CPC ......... B66C 9/04; B66C 9/06; H10P 72/3208; H10P 72/3218; H10P 72/3221
USPC ....................................................... 105/238.1
See application file for complete search history.

(56) References Cited

U.S. PATENT DOCUMENTS

| | | | | |
|---|---|---|---|---|
| 10,023,205 | B2 * | 7/2018 | Kinugawa | B61B 3/02 |
| 2008/0063496 | A1 * | 3/2008 | Bufano | H01L 21/67376<br>414/331.01 |
| 2013/0269564 | A1 * | 10/2013 | Yoo | B66C 9/06<br>104/91 |
| 2016/0288802 | A1 | 10/2016 | Kinugawa et al. | |
| 2017/0197794 | A1 * | 7/2017 | Murao | H01L 21/67706 |
| 2021/0316967 | A1 * | 10/2021 | Sun | H01L 21/67733 |
| 2022/0258990 | A1 * | 8/2022 | Choi | H01L 21/67733 |

FOREIGN PATENT DOCUMENTS

| | | | | | |
|---|---|---|---|---|---|
| CN | 107031664 | A | | 8/2017 | |
| CN | 108116889 | A | | 6/2018 | |
| CN | 113493162 | A | | 10/2021 | |
| CN | 113682751 | A | * | 11/2021 | H01L 21/67703 |
| JP | 3682547 | B2 | | 8/2005 | |
| JP | 2005297683 | A | | 10/2005 | |
| JP | 2020131985 | A | | 8/2020 | |
| JP | 2021185353 | A | * | 12/2021 | B65G 1/1373 |
| KR | 20200102341 | A | * | 8/2020 | H01L 21/67706 |
| KR | 20210107461 | A | * | 9/2021 | H01L 21/6773 |
| TW | 200702267 | A | | 1/2007 | |
| TW | 201700386 | A | | 1/2017 | |
| TW | 202031571 | A | | 9/2020 | |

* cited by examiner

OVERHEAD HOIST TRANSFER SYSTEM, OVERHEAD HOIST TRANSFER, MOVING KIT

CROSS-REFERENCE TO RELATED PATENT APPLICATION

This application claims the benefit of priority to the U.S. Provisional Patent Application Ser. No. 63/302,523 filed on Jan. 24, 2022, and Taiwan Patent Application No. 111150252, filed on Dec. 28, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transfer system, a transfer, and a moving kit, and more particularly to an overhead hoist transfer system, an overhead hoist transfer, and a moving kit installed on the overhead hoist transfer.

BACKGROUND OF THE DISCLOSURE

The conventional common overhead hoist transfer system has been widely applied in the semiconductor industry. Such a system generally includes rails and multiple transfers, and each of the transfers could move along the rail, carrying the transferred load to a specific workstation.

Practically, before the transfers in such a system turn or go straight after passing through the turn rail, it often needs to drive related components through a complex control for the transfers to turn or to go straight after turning successfully. So that making improving the transfer efficiency of the transfer system becomes hardly.

As mentioned above, in practice, in order to ensure that a control module can correctly drive the relevant components before the transfer turns (or before it goes straight after turns), it often needs to operate the control module to start controlling the movement of related components when the transfer is still in a certain distance from an entrance of the turn rail. Since the movement of related components is slow, the speed of the transfer should be reduced synchronously. The transfer efficiency of the transfer is affected.

SUMMARY OF THE DISCLOSURE

The present disclosure provides an overhead hoist transfer system and an overhead hoist transfer to solve the problem that the transfer efficiency of conventional transfer systems cannot be improved.

In one aspect, the present disclosure provides an overhead hoist transfer system, including a plurality of lower straight rails, a plurality of upper rail sets, and at least one overhead hoist transfer. The plurality of lower straight rails are installed in a position close to a ceiling in a factory. The plurality of lower straight rails are disposed side by side. A first lower straight rail and a second lower straight rail of the plurality of lower straight rails are on a same side, and an end of the first lower straight rail and an end of the second lower straight rail are disposed at an interval to form a branching gap. The end of the first lower straight rail and the end of the second lower straight rail forming the branching gap are respectively connected to a lower turn rail. The plurality of lower straight rails form one or more of the branching gaps. Each of the upper rail sets includes an upper straight rail and an upper turn rail. Each of the upper rail sets is adjacent to one of the branching gaps. The upper turn rail is disposed above the lower turn rail connected to one of the lower straight rails forming the branching gap. At least one overhead hoist transfer includes a frame and at least one moving kit. The moving kit is disposed on the frame, the moving kit includes a control module, at least one body, at least two drive wheel sets, two switching modules, and at least two upper guide wheels. The two drive wheel sets are respectively disposed on two opposite sides of the body. Each of the drive wheel sets is adjacent to a lower end of the body. Each of the drive wheel sets includes at least one drive wheel. The control module controls each of the drive wheel sets to allow each of the drive wheels to move on the lower straight rail. The two switching modules are electrically connected to the control module. Each of the upper guide wheels is connected to one of the switching modules, and is disposed at an upper end of the body. Each of the upper guide wheels abuts against the upper turn rail or the upper straight rail. The control module controls each of the switching modules to allow the corresponding upper guide wheel to move toward or away from the body along an inclined path relative to the body. The control module receives transfer information. When the control module determines that the overhead hoist transfer is about to pass the upper rail set according to the transfer information, the control module controls at least one of the switching modules to allow the corresponding upper guide wheel to move toward or away from the body along the inclined path.

In another aspect, the present disclosure provides an overhead hoist transfer applicable for an overhead hoist transfer system. The overhead hoist transfer system includes a plurality of lower straight rails and a plurality of upper rail sets. The plurality of lower straight rails are installed in a position close to a ceiling in a factory. The plurality of lower straight rails are disposed side by side. A first lower straight rail and a second lower straight rail of the plurality of lower straight rails are on a same side, and are disposed at an interval to form a branching gap. The end of the first lower straight rail and the end of the second lower straight rail forming the branching gap are respectively connected to a lower turn rail. The plurality of lower straight rails form one or more of the branching gaps. Each of the upper rail sets includes an upper straight rail and an upper turn rail. Each of the upper rail sets is adjacent to one of the branching gaps. The upper turn rail is disposed above the lower turn rail connected to one of the lower straight rails forming the branching gap. The overhead hoist transfer includes a frame and at least one moving kit. The frame carries a to-be-transferred object. The moving kit is disposed on the frame, the moving kit includes a control module, at least one body, at least two drive wheel sets, two switching modules, and at least two upper guide wheels. The two drive wheel sets are respectively disposed on two opposite sides of the body. Each of the drive wheel sets is adjacent to a lower end of the body. Each of the drive wheel sets includes at least one drive wheel. The control module controls each of the drive wheel sets to allow each of the drive wheels to move on the lower straight rail. The two switching modules are electrically connected to the control module. Each of the upper guide wheels is connected to one of the switching modules, and is disposed at an upper end of the body. Each of the upper guide wheels abuts against the upper turn rail or the upper straight rail. The control module controls each of the switching modules to allow the corresponding upper guide wheel to move toward or away from the body along an inclined path relative to the body. The control module receives transfer information. When the control module determines that the overhead hoist transfer is about to pass the upper rail set according to the transfer information, the control module controls at least one of the switching modules to allow the corresponding upper guide wheel to move toward or away from the body along the inclined path.

In the other aspect, the present disclosure provides a moving kit disposed on a frame of an overhead hoist transfer. The frame is used to carry a to-be-transferred object. The overhead hoist transfer moves along a plurality of lower straight rails and a plurality of upper rail sets of an overhead hoist transfer system through the moving kit. The plurality of lower straight rails are installed in a position close to a ceiling in a factory. The plurality of lower straight rails are disposed side by side. A first lower straight rail and a second lower straight rail of the plurality of lower straight rails are on a same side, and an end of the first lower straight rail and an end of the second lower straight rail are disposed at an interval to form a branching gap. The end of the first lower straight rail and the end of the second lower straight rail forming the branching gap are respectively connected to a lower turn rail. The plurality of lower straight rails form one or more of the branching gaps. Each of the upper rail sets includes an upper straight rail and an upper turn rail. Each of the upper rail sets is adjacent to one of the branching gaps. The upper turn rail is disposed above the lower turn rail connected to one of the lower straight rails forming the branching gap. The moving kit includes a control module, at least one body, at least two drive wheel sets, two switching modules, and at least two upper guide wheels. The two drive wheel sets are respectively disposed on two opposite sides of the body. Each of the drive wheel sets is adjacent to a lower end of the body. Each of the drive wheel sets includes at least one drive wheel. The control module controls each of the drive wheel sets to allow each of the drive wheels to move on the lower straight rail. The two switching modules are electrically connected to the control module. Each of the upper guide wheels is connected to one of the switching modules, and is disposed at an upper end of the body. Each of the upper guide wheels abuts against the upper turn rail or the upper straight rail. The control module controls each of the switching modules to allow the corresponding upper guide wheel to move toward or away from the body along an inclined path relative to the body. The control module receives transfer information. When the control module determines that the overhead hoist transfer is about to pass the upper rail set according to the transfer information, the control module controls at least one of the switching modules to allow the corresponding upper guide wheel to move toward or away from the body along the inclined path.

Therefore, the overhead hoist transfer system and the transfer, which are provided by the present disclosure could have improved transferring efficiency compared to those of prior art by cooperating the control module, the guide wheel moving device, the drive wheel set, and upper guide wheel of the moving kit with the upper straight and turn rails of the upper rail set and the lower rail.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
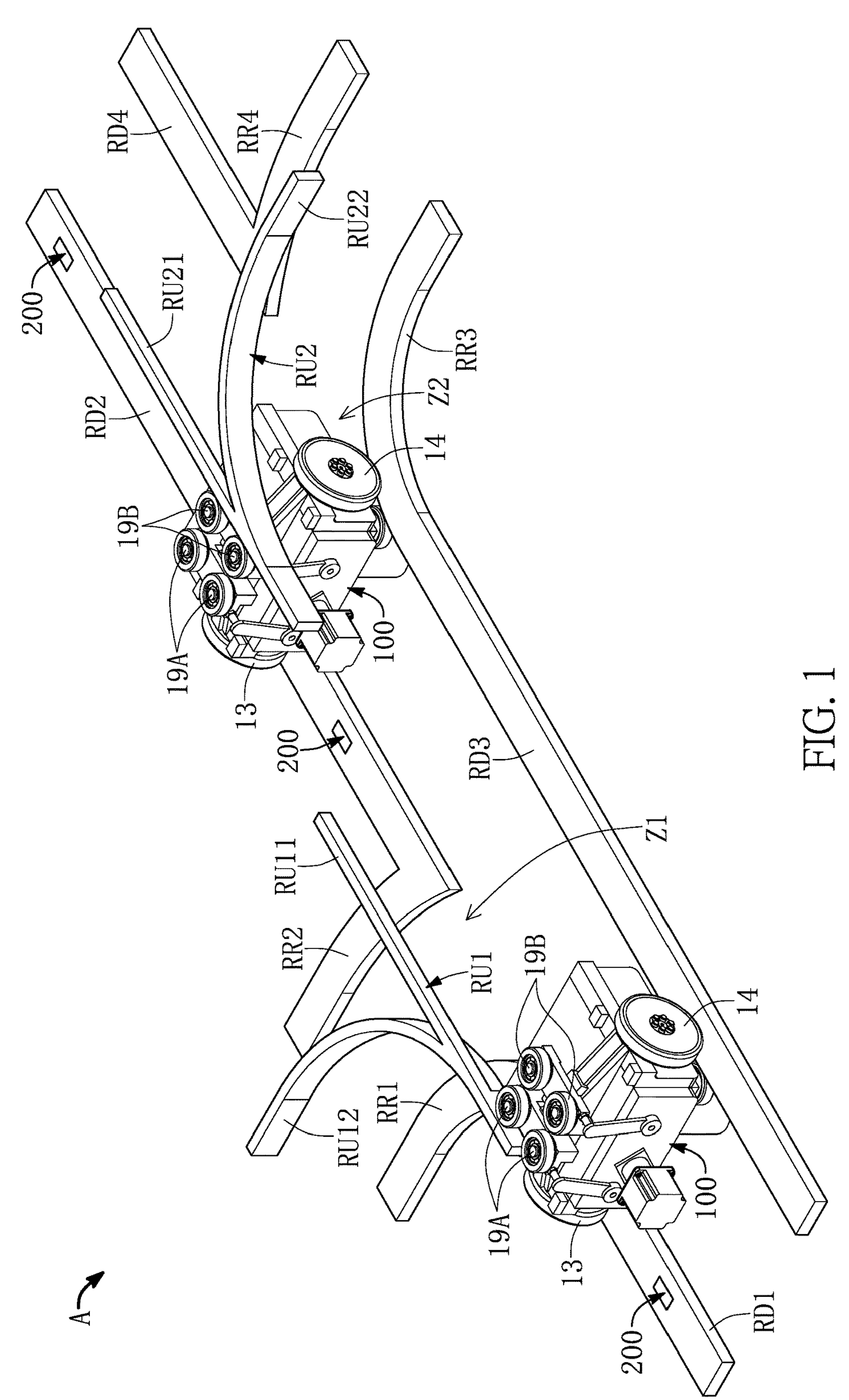
FIG. 1 and FIG. 2 are schematic perspective views from different angles of view of an overhead hoist transfer system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
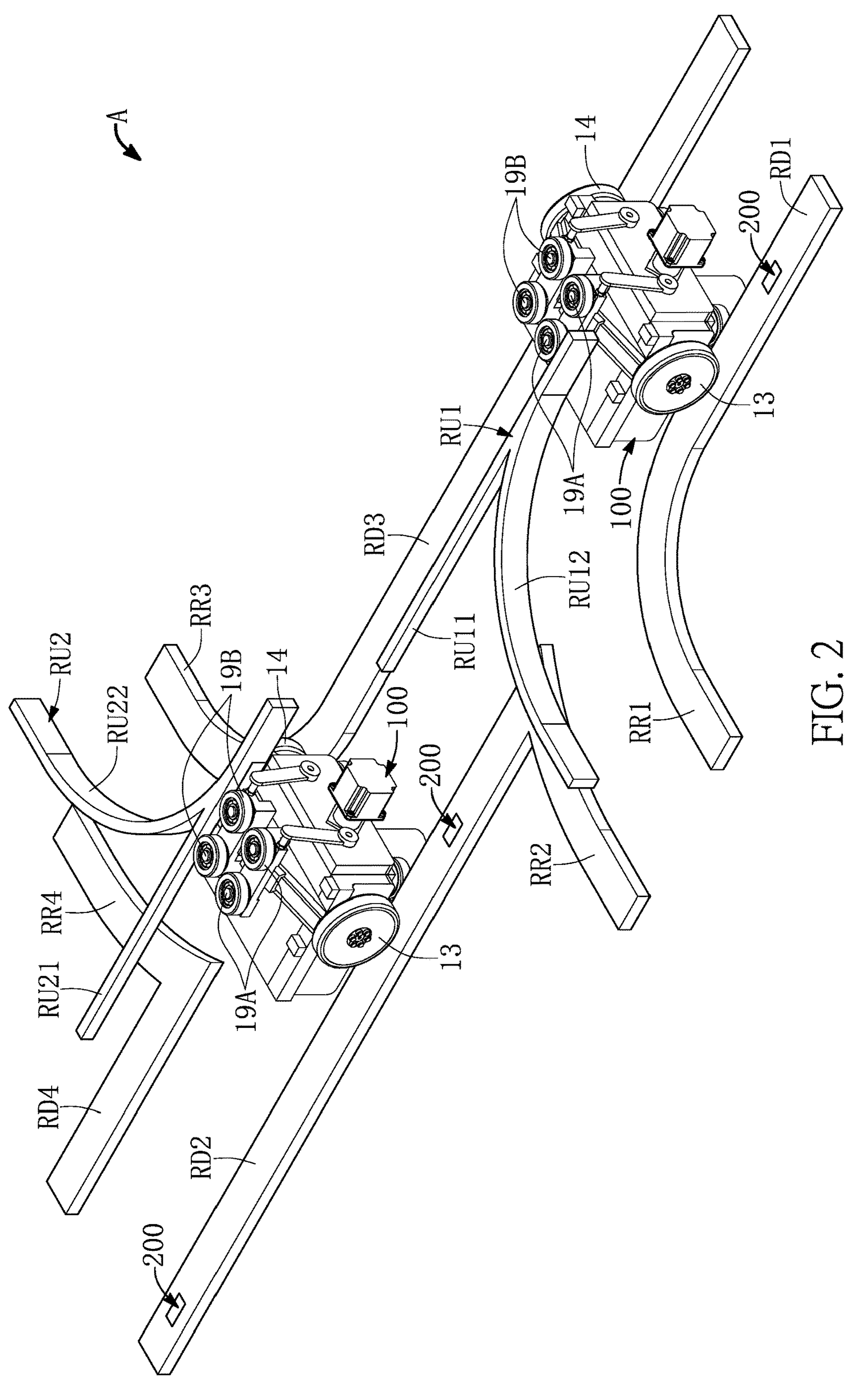

FIG. 1 and FIG. 2 are schematic perspective views from different angles of view of an overhead hoist transfer system according to a first embodiment of the present disclosure. The overhead hoist transfer system A of the present disclosure is fixedly installed in various factory buildings adjacent to a ceiling and is particularly applicable to semiconductor factories. The overhead hoist transfer system A includes a plurality of lower straight rails, a plurality of lower turn rails, a plurality of upper rail sets, and a plurality of overhead hoist transfers 100. Each overhead hoist transfer 100 is used to carry a to-be-transferred object, and mainly moves in the factory along the plurality of lower straight rails and the plurality of lower turn rails. When the overhead hoist transfer 100 passes a position for turning by moving along the lower straight rail and the lower turn rail, the overhead hoist transfer 100 is guided by the adjacent upper rail set for turning.

In the drawings of this embodiment, only a part of the lower straight rail, a part of the lower turn rail, a part of the upper rail set, and a part of the overhead hoist transfer of the overhead hoist transfer system A are shown. In practice, the number of the lower straight rails, the lower turn rails, the upper rail sets, and the overhead hoist transfers 100 of the overhead hoist transfer system A can be predetermined according to actual factory space, so is not limited herein.

The plurality of lower straight rails and the plurality of lower turn rails are installed close to the ceiling of the factory. In practice, each lower straight rail and each lower turn rail can be hung by means of brackets and set at the positions adjacent to the ceiling of the factory. The plurality of lower straight rails are arranged side by side, and the plurality of lower straight rails form at least one branching gap. Specifically, a first lower straight rail and a second lower straight rail are on a same side, and are disposed at an interval to form a branching gap, and the end of the first lower straight rail and the end of the second lower straight rail forming the branching gap are respectively connected to a lower turn rail.

For description, in this embodiment, four lower straight rails shown in the drawings of this embodiment are respectively defined as a first lower straight rail RD1, a second lower straight rail RD2, a third lower straight rail RD3, and a fourth lower straight rail RD4, and four lower turn rails shown in the drawings are respectively defined as a first lower turn rail RR1, a second lower turn rail RR2, a third lower turn rail RR3, and a fourth lower turn rail RR4. One end of the first lower straight rail RD1 and one end of the second lower straight rail RD2 are disposed oppositely to form a first branching gap Z1. The end of the first lower straight rail RD1 is connected to the first lower turn rail RR1, and the end of the second lower straight rail RD2 is connected to the second lower turn rail RR2. One end of the third lower straight rail RD3 and one end of the fourth lower straight rail RD4 are disposed oppositely to form a second branching gap Z2. The end of the third lower straight rail RD3 is connected to the third lower turn rail RR3, and the end of the fourth lower straight rail RD4 is connected to the fourth lower turn rail RR4.

The first lower straight rail RD1 and the second lower straight rail RD2 are disposed on a same side, and are arranged side by side in a front-to-rear manner, and the third lower straight rail RD3 and the fourth lower straight rail RD4 are disposed on a same side, and are arranged side by side in a front-to-rear manner. The first lower straight rail RD1 and the third lower straight rail RD3 are arranged side by side in a left-to-right manner, and the second lower straight rail RD2 and the fourth lower straight rail RD4 are arranged side by side in a left-to-right manner. There is no lower straight rail or lower turn rail in any of the branching gaps. A distance between two lower straight rails forming the branching gap and a width of the rail gap can be designed according to an actual size of the overhead hoist transfer 100. Therefore, the example shown in the drawing is just one of the embodiments.

It should be noted that in the drawings of this embodiment, it is taken as an example that the first branching gap Z1 and the second branching gap Z2 are located on different sides, but it is not limited thereto. In practice, it can be determined whether the two adjacent branching gaps are located on same side or on different sides according to an actual position of turning of the overhead hoist transfer 100.

The two upper rail sets are respectively defined as a first upper rail set RU1 and a second upper rail set RU2. The first upper rail set RU1 and the second upper rail set RU2 are respectively adjacent to the first branching gap Z1 and the second branching gap Z2.

The first upper rail set RU1 includes a first upper straight rail RU11 and a first upper turn rail RU12, and one end of the first upper straight rail RU11 is connected to one end of the first upper turn rail RU12. The first upper rail set RU1 is disposed above the first lower straight rail RD1 and the second lower straight rail RD2, a part of the first upper straight rail RU11 is disposed above the first branching gap Z1, and the first upper turn rail RU12 is disposed above the first lower turn rail RR1. It should be noted that in different embodiments, the first lower turn rail RR1 may also be disposed above the second lower turn rail RR2.

The second upper rail set RU2 includes a second upper straight rail RU21 and a second upper turn rail RU22, and one end of the second upper straight rail RU21 is connected to one end of the second upper turn rail RU22. The second upper rail set RU2 is disposed above the third lower straight rail RD3 and the fourth lower straight rail RD4, a part of the second upper straight rail RU21 is disposed above the second branching gap Z2, and the second upper turn rail RU22 is disposed above the third lower turn rail RR3. It should be noted that in different embodiments, the second lower turn rail RR2 may also be disposed above the fourth lower turn rail RR4.

It should be noted that the upper rail set is not necessarily disposed above any lower straight rail, however any upper rail set must be adjacent to one of the branching gaps, that is, the upper rail set is provided only above the branching gap.

Figure 3:
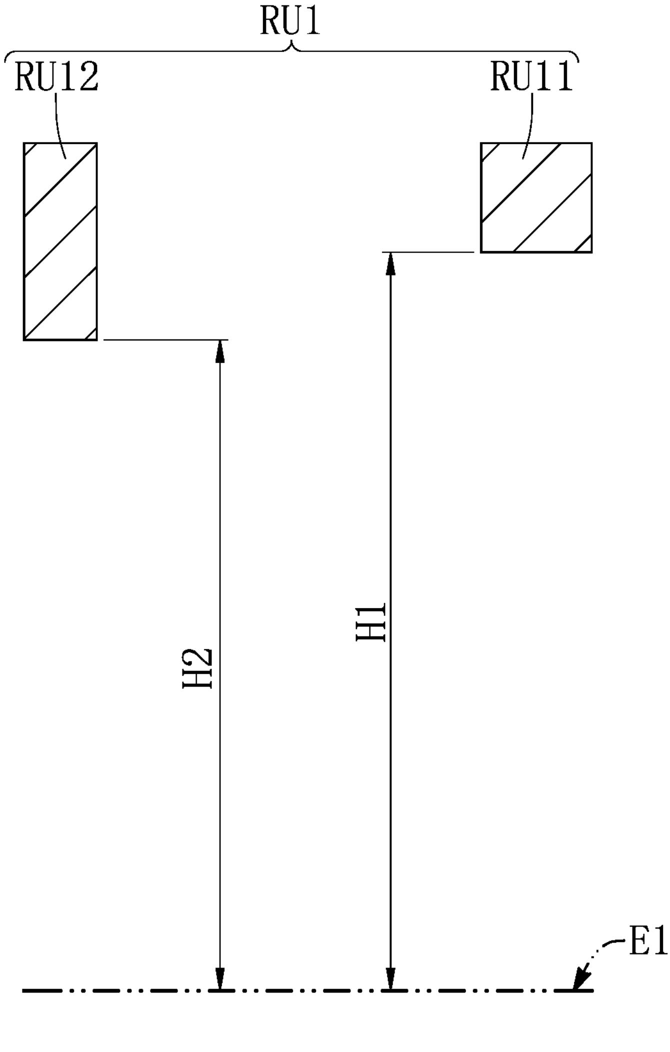
FIG. 3 is a schematic cross-sectional view of a first upper straight rail and a first upper turn rail of a first upper rail set of the overhead hoist transfer system according to the first embodiment of the present disclosure.

FIG. 3 is a schematic cross-sectional view of a first upper straight rail and a first upper turn rail of a first upper rail set. A straight distance between a lower edge of the first upper straight rail RU11 of the first upper rail set RU1 and a plane E1 where the first lower straight rail RD1 is located is defined as a first height H1, and a straight distance between the lower edge of the first upper turn rail RU12 and the plane E1 is defined as a second height H2. The first height H1 is greater than the second height H2, and a surface on which the drive wheel moves on the first lower straight rail RD1 is a same plane as the plane E1.

Figure 4:
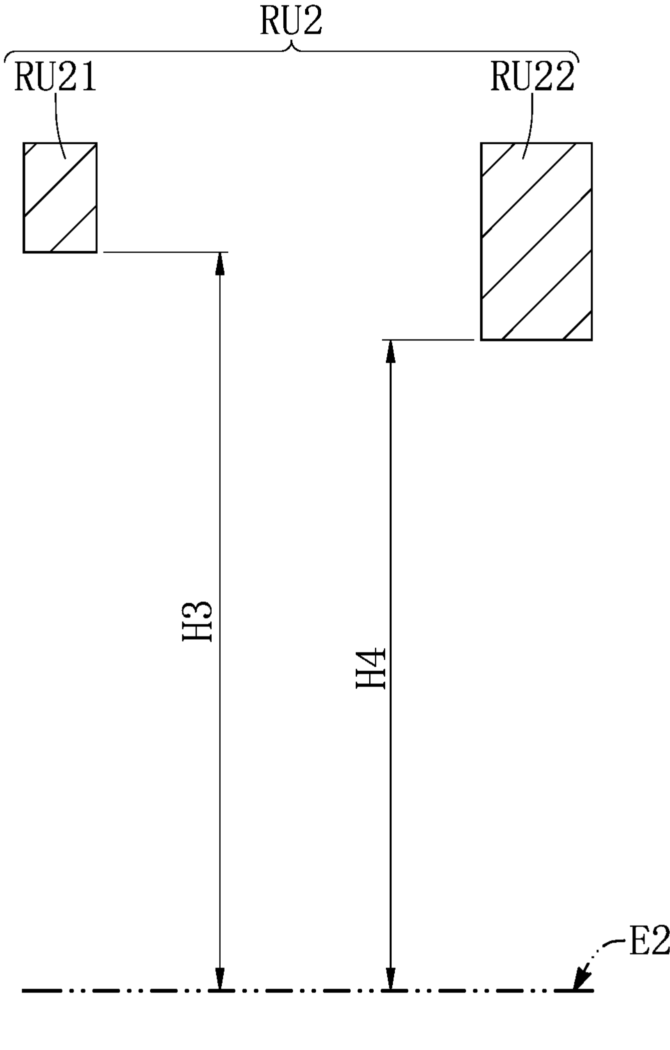
FIG. 4 is a schematic cross-sectional view of a second upper straight rail and a second upper turn rail of a second upper rail set of the overhead hoist transfer system according to the first embodiment of the present disclosure.

FIG. 4 is a schematic cross-sectional view of a second upper straight rail and a second upper turn rail of a second upper rail set. A straight distance between a lower edge of the second upper straight rail RU21 of the second upper rail set RU2 and a plane E2 where the adjacent third lower straight rail RD3 is located is defined as a third height H3, and a straight distance between a lower edge of the second upper turn rail RU22 and the plane E2 is defined as a fourth height H4. The third height H3 is greater than the fourth height H4, and a surface on which the drive wheel moves on the third lower straight rail RD3 is a same plane as the plane E2.

Figure 5:
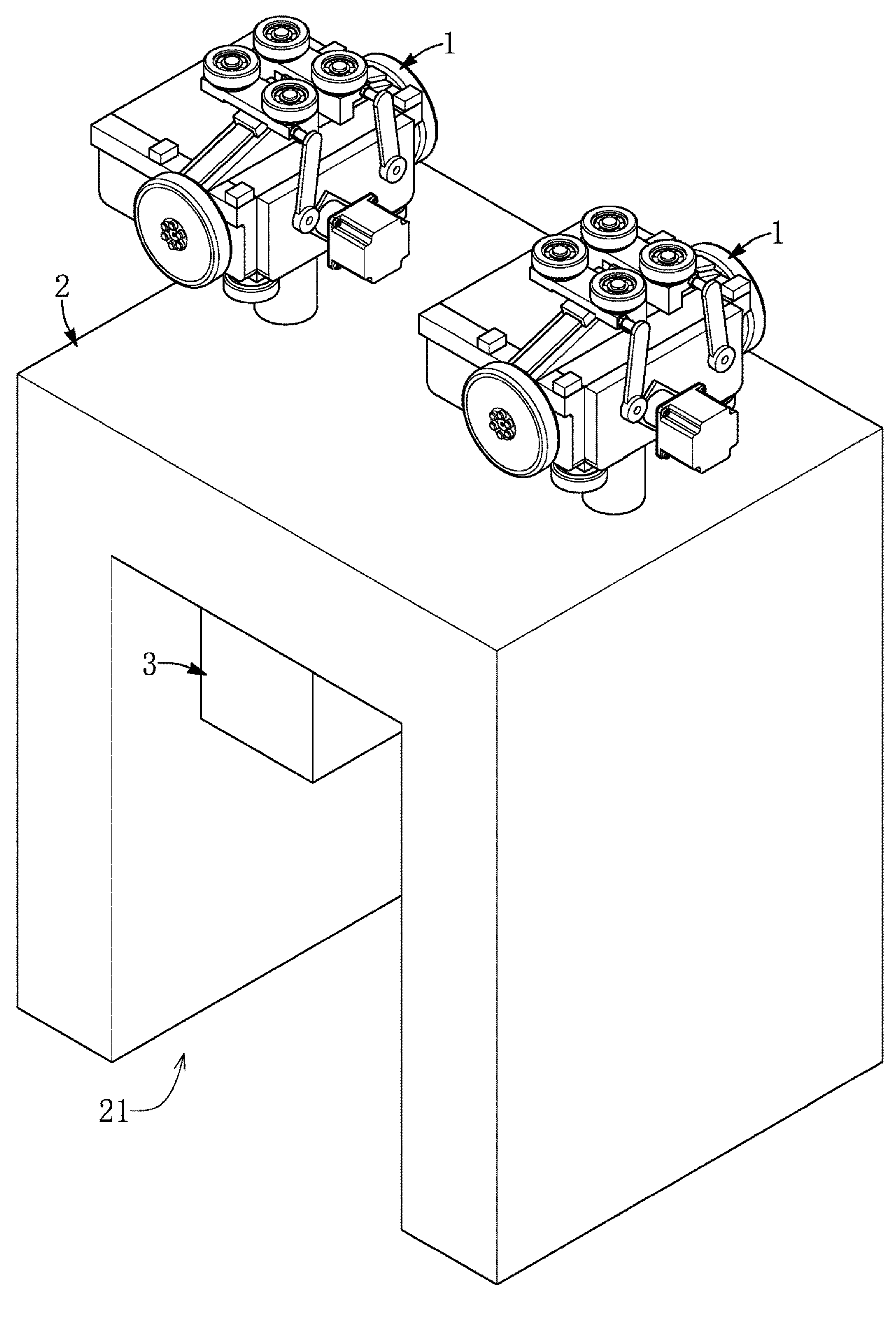
FIG. 5 is a schematic view of an overhead hoist transfer of the present disclosure.

FIG. 5 is a schematic view of an overhead hoist transfer. The overhead hoist transfer 100 may include, for example, two moving kits 1, a frame 2, and a carrier holder 3. The two moving kits 1 are disposed on a top of the frame 2, and a bottom of the frame 2 includes an accommodating space 21. The accommodating space 21 accommodates a carrier. The carrier holder 3 is disposed at the frame 2, and the carrier holder 3 is disposed in the accommodating space 21 for holding the carrier. The carrier is used to carry to-be-transferred objects. The overhead hoist transfer 100 mainly moves along the lower straight rail and the lower turn rail through the moving kit 1, and carries the to-be-transferred objects by the frame 2 and the carrier holder 3. It should be noted that, in order to clearly illustrate the movement of the overhead hoist transfer 100 on the lower straight rail, the lower turn rail, and the upper rail set, in the drawings for various embodiments, only a single moving kit 1 of the overhead hoist transfer 100 is shown as a representative, and other components included in the overhead hoist transfer 100 are omitted.

When the overhead hoist transfer system A of the present disclosure is applied in a semiconductor factory, the carrier can be, for example, a wafer carrier (such as various FOUPs, etc.), and the carrier holder 3 can be a carrier that holds or no longer holds the wafer. In different embodiments, the carrier holder 3 may also be a carrier capable of rotating the wafers it holds.

It should be noted that in this embodiment, the application of the overhead hoist transfer 100 in a semiconductor factory is taken as an example, which makes the overhead hoist transfer 100 including two moving kits 1, a frame 2, and a carrier holder 3. However, in different scenarios, the overhead hoist transfer 100 may also include a single moving kit 1 only, the overhead hoist transfer 100 may also not include the carrier holder 3, and the frame 2 may directly carry the to-be-transferred objects.

Figure 6:
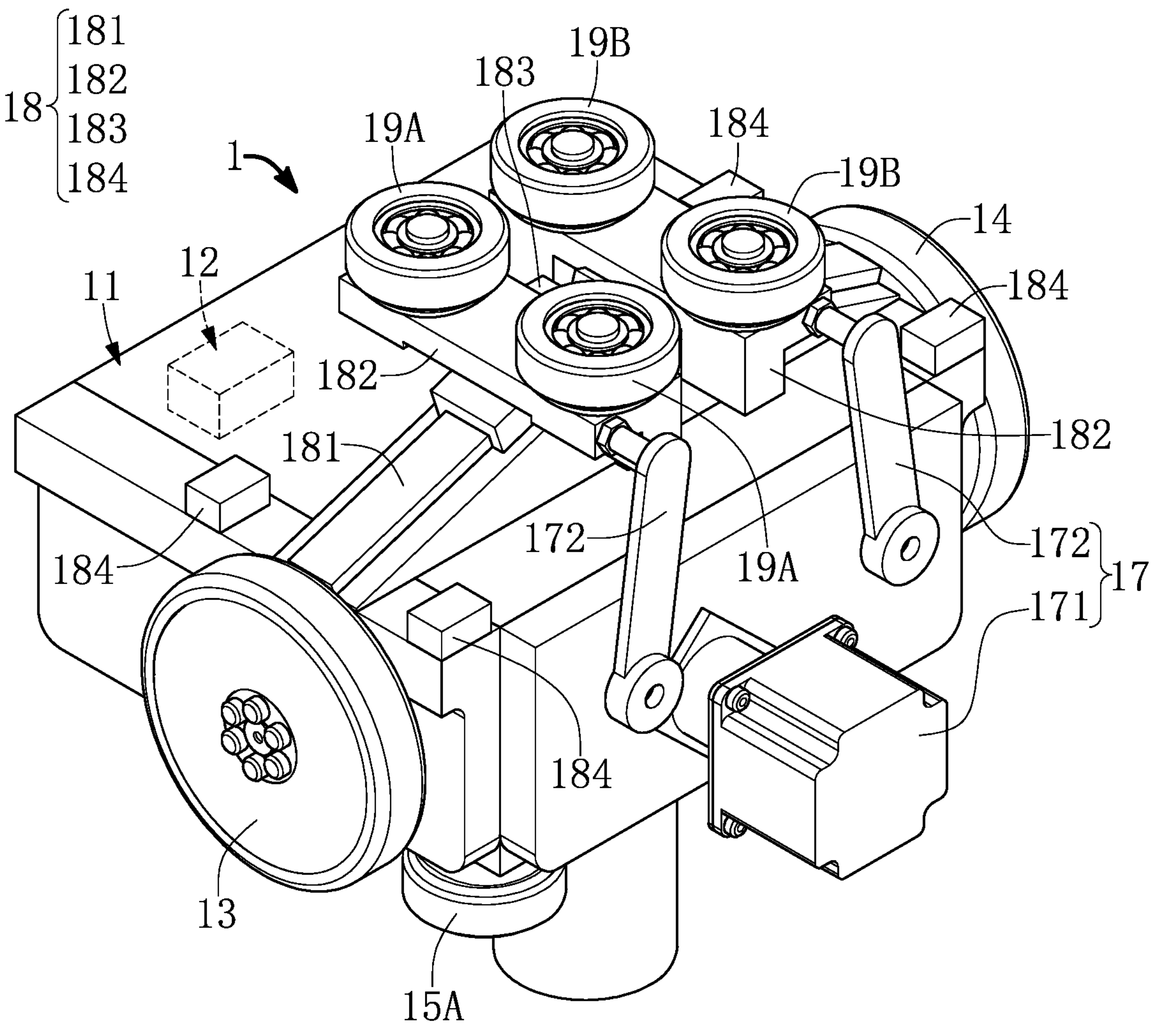
FIG. 6 and FIG. 7 are schematic views from different angles of view showing that an upper guide wheel of a moving kit of the overhead hoist transfer of the present disclosure is located at an upper position.
Figure 7:
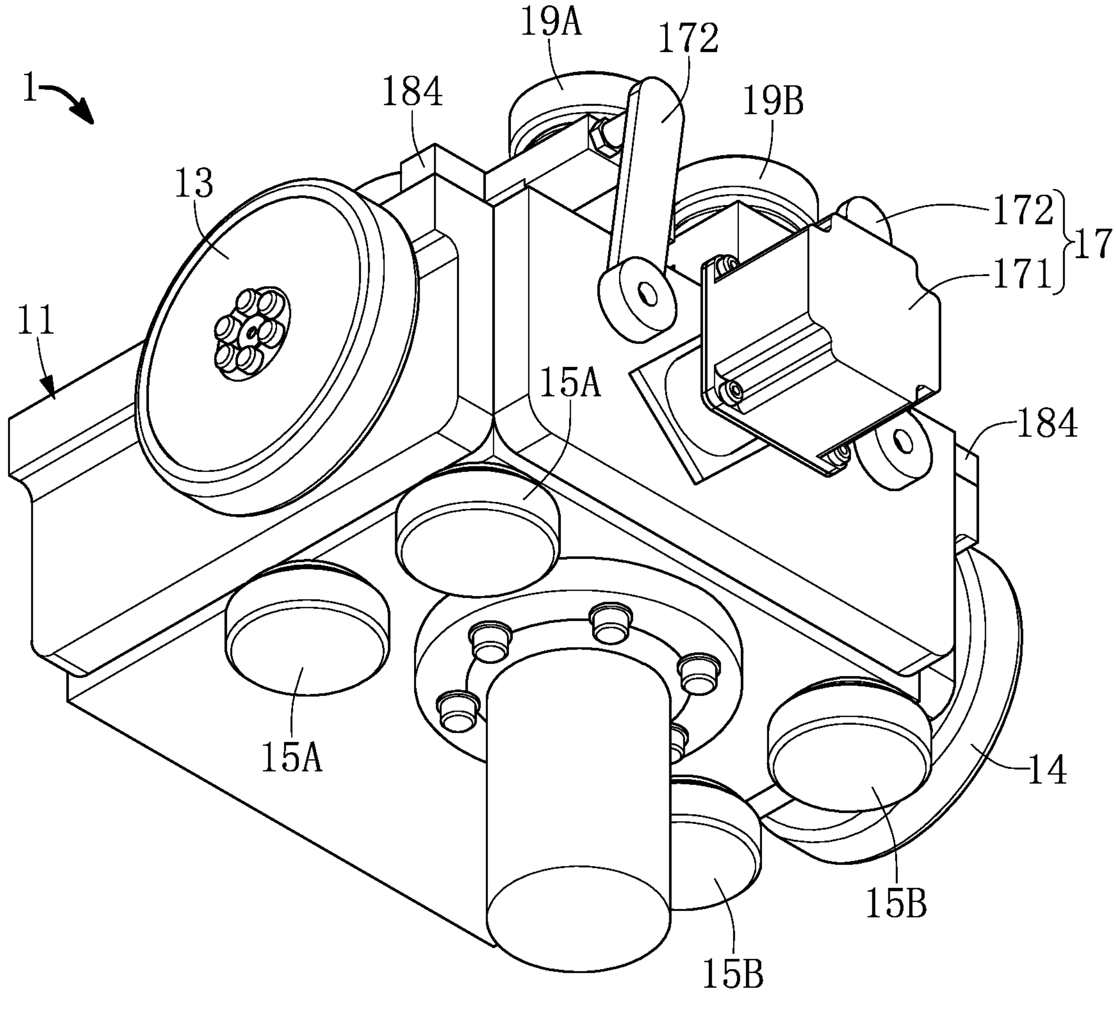
Figure 8:
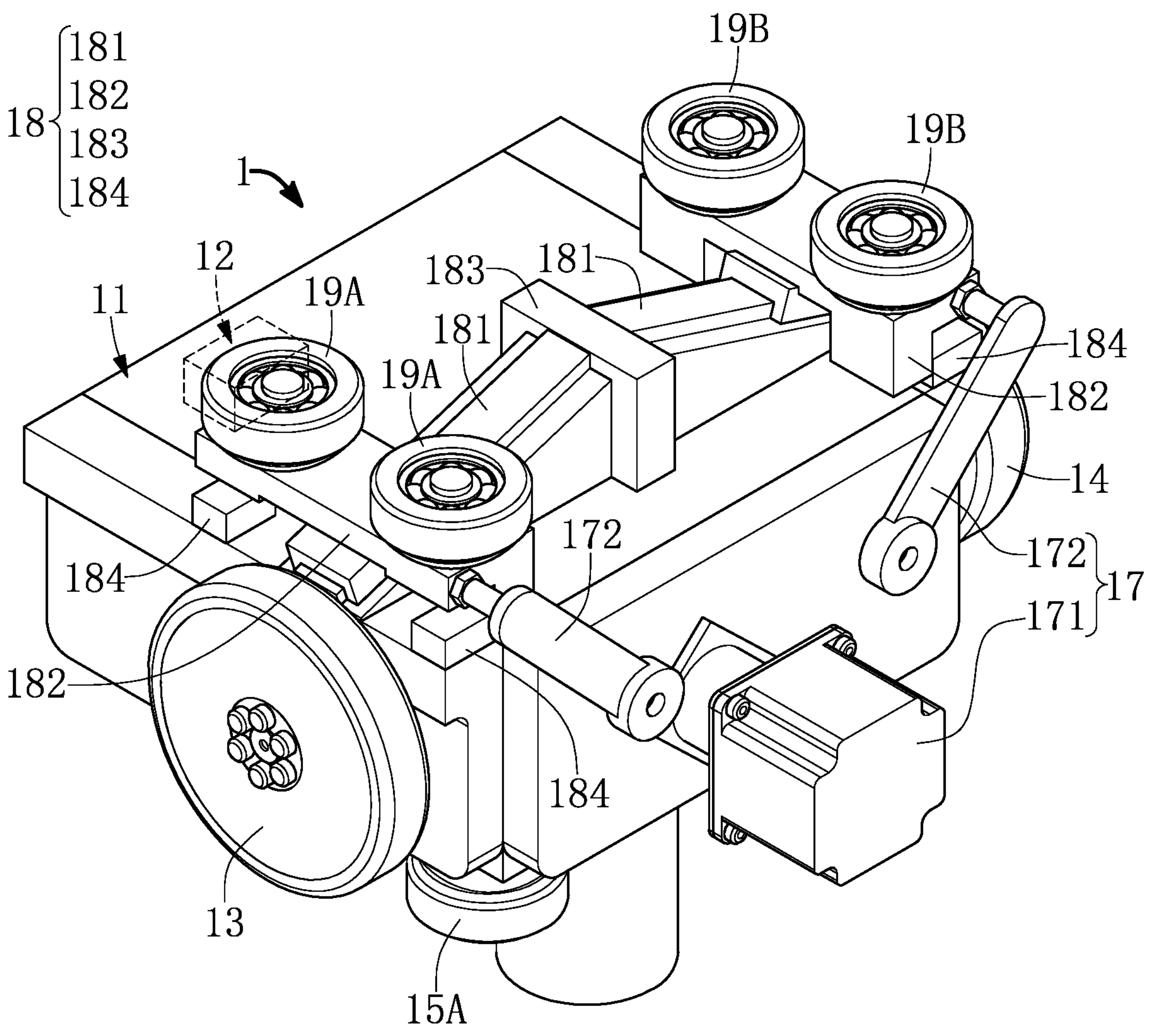
FIG. 8 is a schematic view showing that the upper guide wheel of the moving kit of the overhead hoist transfer of the present disclosure is located at a lower position.
Figure 9:
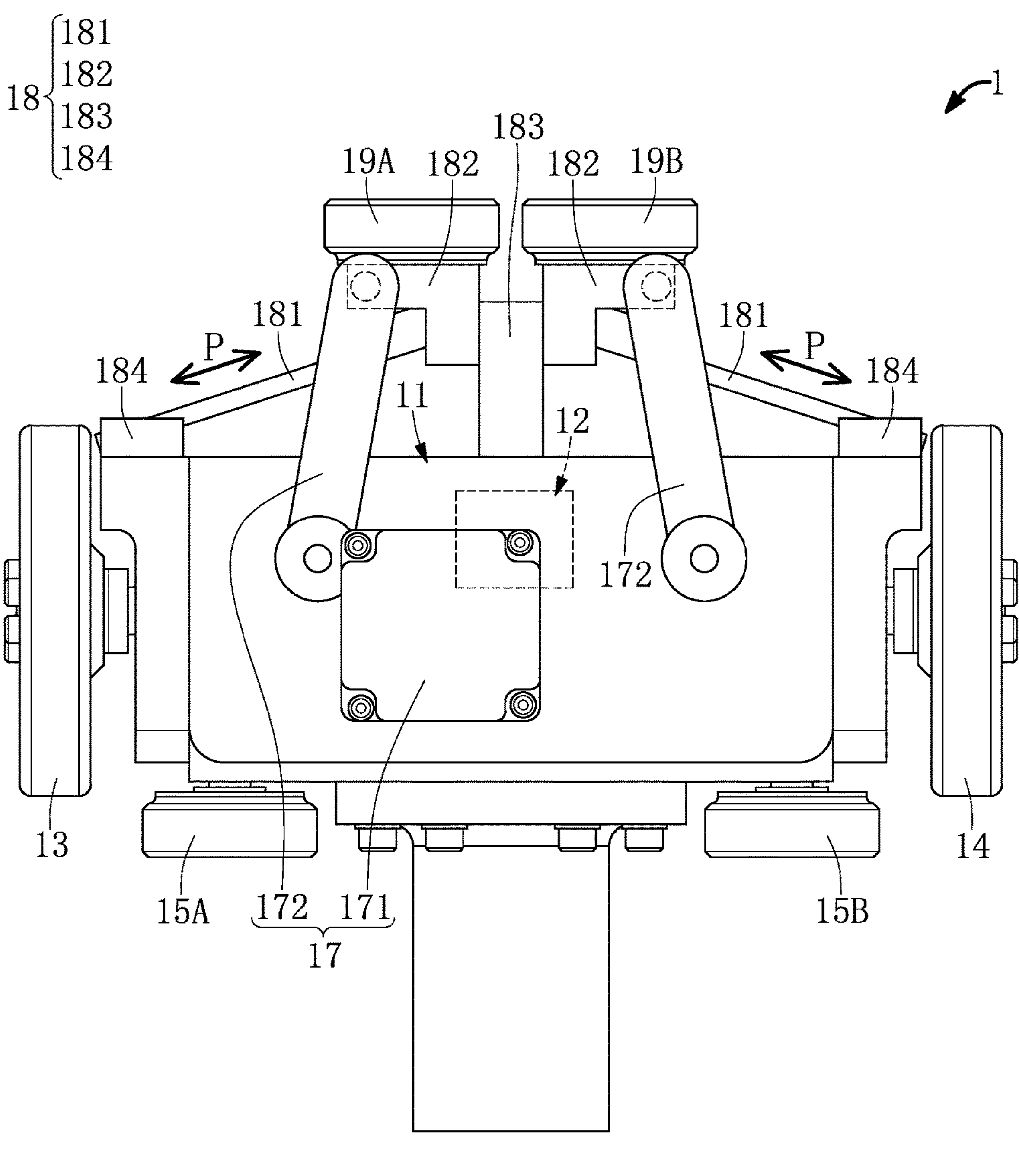
FIG. 9 and FIG. 10 are rear views showing that the upper guide wheel of the moving kit of the overhead hoist transfer of the present disclosure is located at the upper position and the lower position.
Figure 10:
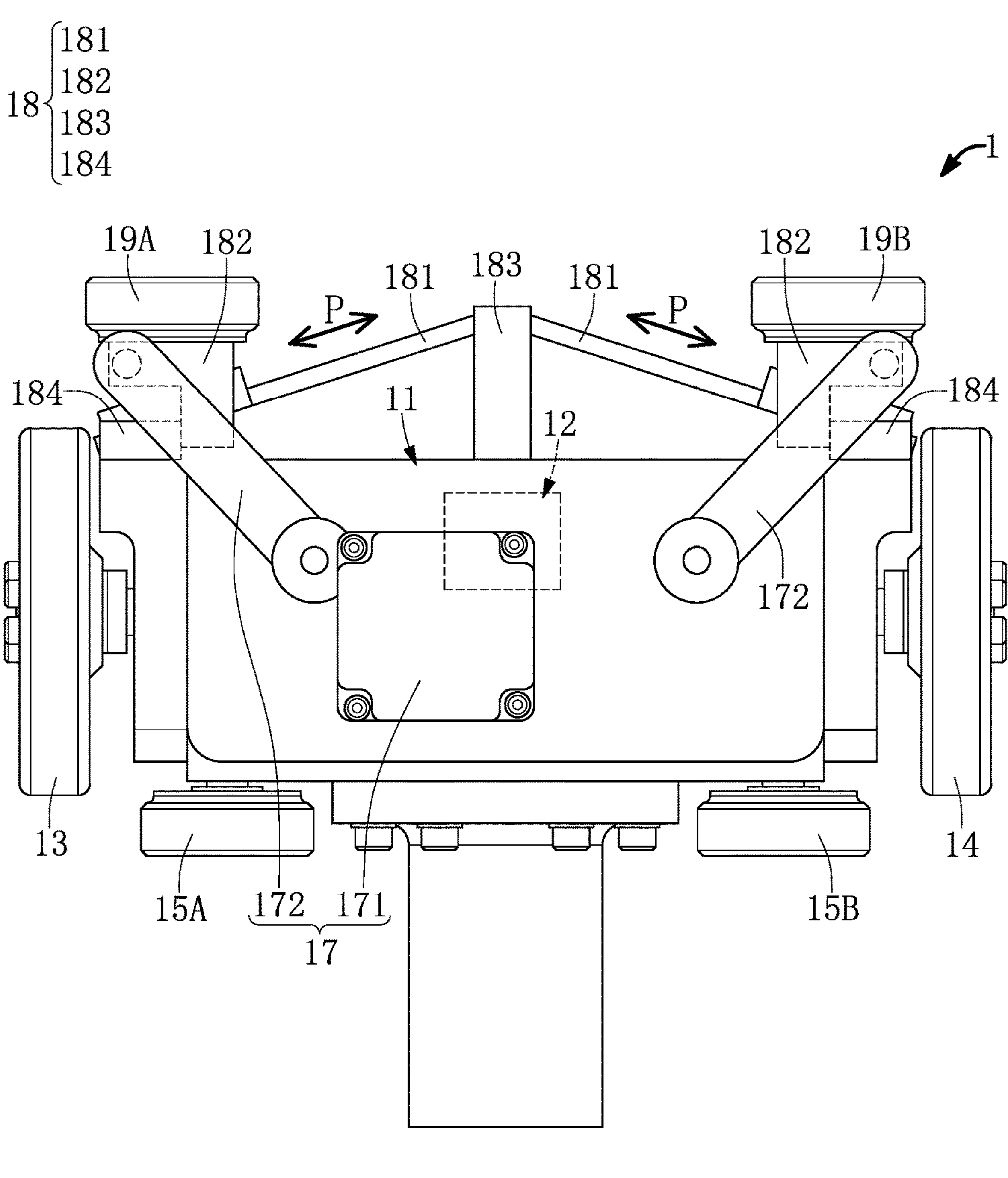

FIG. 6 and FIG. 7 are schematic views from different angles of view showing that an upper guide wheel of a moving kit of the overhead hoist transfer of the present disclosure is located at an upper position. FIG. 8 is a schematic view showing that the upper guide wheel of the moving kit of the overhead hoist transfer of the present disclosure is located at a lower position. FIG. 9 and FIG. 10 are rear views showing that the upper guide wheel of the moving kit of the overhead hoist transfer of the present disclosure is located at the upper position and the lower position.

The moving kit 1 includes a body 11, a control module 12, two drive wheel sets (a first drive wheel set and a second drive wheel set), four lower guide wheels (two first lower guide wheels 15A and two second lower guide wheels 15B), a guide wheel moving device 17, two switching modules 18, and four upper guide wheels (first upper guide wheel 19A and second upper guide wheel 19B). The control module 12, the two drive wheel sets, the guide wheel moving device 17, the two switching modules 18, the four lower guide wheels, and the four upper guide wheels are all disposed at the body 11. The number of the drive wheel sets, the lower guide wheels, the switching module 18, and the upper guide wheels of the moving kit 1 is not limited to those shown in the drawings, and can be changed according to actual requirements.

The control module 12 can receive the transfer information transmitted by an external electronic device (such as a central control system in the factory), thereby controlling the two drive wheel sets and the guide wheel moving device 17 to allow the overhead hoist transfer 100 to move straight, turn, etc. along the lower straight rail and the lower turn rail. So that the overhead hoist transfer 100 can move to a designated location (for example, an area where the lower straight rail is adjacent to a certain work station).

The two drive wheel sets are respectively defined as a first drive wheel set and a second drive wheel set, which are disposed on opposite sides of the body 11. The first drive wheel set, for example, may include a first drive wheel 13 and a drive motor, and the second drive wheel set, for example, may include a second drive wheel 14 and a drive motor. Both of the first drive wheel 13 and the second drive wheel 14 are disposed adjacent to a lower end of the body 11 (that is, an end of the body 11 adjacent to the lower straight rail). The control module 12 can control each of the drive motors according to the transfer information, so as to rotate the first drive wheel 13 and the second drive wheel 14, so that the moving kit 1 can drive the overhead hoist transfer 100 to move on the lower straight rail. In different embodiments, the first drive wheel set and the second drive wheel set can share a same drive motor that can drive the first drive wheel 13 and the second drive wheel 14 to rotate synchronously through transmission components such as gears or belts.

The four guide wheels are rotatably disposed at the lower end of the body 11. Each of the lower guide wheels can rotate independently relative to the body 11, and each of the lower guide wheels rotates around a longitudinal axis, while each of the drive wheel sets rotates around a transverse axis. That is, the two drive wheel sets roll against a top surface of the lower straight rail, and each of the lower guide wheels moves against a side surface (the surface adjacent to the top surface) of the lower straight rail. Through the four lower guide wheels, the body 11 is not easy to tilt when moving straightly along the lower straight rail, so the body 11 can stably move straightly along the lower straight rail, and also the body 11 is not easy to shake when turning and moving along the lower turn rail, so that the body 11 can turn and move along the lower turn rail more stably. For the purpose of description, the two lower guide wheels on a same side of the body 11 are defined as first lower guide wheels 15A, and the two lower guide wheels on the other side are defined as second lower guide wheels 15B.

The guide wheel moving device 17 is electrically connected to the control module 12 and is connected with two switching modules 18. One of the switching modules 18 is connected to the two first upper guide wheels 19A, and the other switching module 18 is connected to the other two second upper guide wheels 19B. The two switching modules 18, the two first upper guide wheels 19A, and the two second upper guide wheels 19B are disposed at an upper end of the body 11. The control module 12 can control the guide wheel moving device 17 to actuate the two switch modules 18, so that each of the upper guide wheels can move along an inclined path P toward or away from the body 11, and can move between an upper position away from the body 11 (as shown in FIG. 9) and a lower position close to the body 11 (as shown in FIG. 10). In practice, each of the upper guide wheels may move along the inclined path P approximately toward a central position close to the body 11, or move along the inclined path P approximately away from the central position of the body 11. Each of the upper guide wheels abuts against the upper rail set, so that the body 11 can move along the upper straight rail or the upper turn rail of the upper rail set.

In practice, each of the switching modules 18 may include two inclined guide rails 181, two sliders 182, an upper stop member 183, and four lower stop members 184. The two inclined guide rails 181 can be disposed side by side on the upper end of the body 11, and one end of the one inclined guide rail 181 and one end of the other inclined guide rail 181 can be adjacently disposed.

One of the sliders 182 is disposed at each of the inclined guide rails 181, and is connected with two first upper guide wheels 19A, and each of the first upper guide wheels 19A can rotate independently on the slider 182. Another one of the sliders 182 is connected with two second upper guide wheels 19B, and each of the second of the upper guide wheels 19B can rotate independently on the slider 182. Each of the first upper guide wheels 19A and each of the second upper guide wheels 19B can rotate relative to the slider 182 with a longitudinal axis. In practice, each of the first upper guide wheels 19A, each of the second upper guide wheels 19B, each of the first lower guide wheels 15A, and each of the second lower guide wheels 15B respectively rotate around mutually parallel longitudinal axes.

Each of the first upper guide wheels 19A can move along the inclined guide rail 181 through the corresponding slider 182, so as to move between the upper position and the lower position along the inclined path P. Each of the second upper guide wheels 19B can move along the inclined guide rail 181 through the corresponding slider 182 to move between the upper position and the lower position along the inclined path P.

When the two first upper guide wheels 19A are in the upper position, the two first upper guide wheels 19A may be approximately located above the center of the body 11, and when the two first upper guide wheels 19A are in the lower position, the two first upper guide wheels 19A can be roughly located at one side of the body 11. Similarly, when the two second upper guide wheels 19B are located at the upper position, the two second upper guide wheels 19B may be located approximately located above the center of the body 11, and when the two second upper guide wheels 19B are located at the lower position, the two second upper guide wheels 19B may be located approximately at one side of the body 11.

That is, when any upper guide wheel (the first upper guide wheel 19A or the second upper guide wheel 19B) moves from the lower position to the upper position along the inclined path P with the slider 182, the upper guide wheel can move towards a direction close to the center of the body 11 and a direction away from one side of the body 11 at the same time. On the contrary, when any upper guide wheel moves from the upper position to the lower position along the inclined path P with the slider 182, the upper guide wheel moves away from the center of the body 11 and toward one side of the body 11 at the same time.

The guide wheel moving device 17 may include a drive unit 171, a transmission component (not shown) and two linkage components 172. The drive unit 171 is disposed at the body 11, and the drive unit 171 may be, for example, a motor. The transmission component is connected to the drive unit 171, and the transmission component may be, for example, a gear or a belt. Each of the linkage components 172 is connected to the drive unit 171 through a transmission component, and one of the linkage components 172 is connected to one of the sliders 182 and the other linkage component 172 is connected to the other slider 182.

When the control module 12 controls the drive unit 171 of the guide wheel moving device 17 to operate, the drive unit 171 can through the transmission component allow the two linkage components 172 to rotate simultaneously. The two linkage components 172 rotating synchronously can drive the sliders 182 which connected with them to move on the inclined guide rails 181 along the inclined path P. In this way, the two upper guide wheels (the first upper guide wheel 19A or the second upper guide wheel 19B) respectively disposed on the sliders 182 can be moved to the upper position or the lower position away from or close to the body 11.

In different embodiments, the moving kit 1 can also include two guide wheel moving devices 17. One of the guide wheel moving devices 17 is connected to one of the switching modules 18, and the other guide wheel moving device 17 is connected to the other switching module 18. The control module 12 can individually control any one of the guide wheel moving devices 17 to allow the corresponding two upper guide wheels (the first upper guide wheel 19A or second upper guide wheel 19B) to move to the upper position or the lower position independently from the other two upper guide wheels (the second upper guide wheel 19B or first upper guide wheel 19A). That is, in one case, the two upper guide wheels (the first upper guide wheel 19A or the second upper guide wheel 19B) disposed on one of the sliders 182 may be at the upper position, and the two upper guide wheels (the second upper guide wheel 19B or the first upper guide wheel 19A) disposed on the other slider 182 are located at the lower position.

As shown in FIG. 6, FIG. 8, FIG. 9, and FIG. 10, the upper stop member 183 is disposed between adjacent ends of the two inclined guide rails 181. Two lower stop members 184 are disposed at one end of one of the inclined guide rails 181, and the other two lower stop members 184 are disposed at the other end of the other inclined guide rail 181. When the two first upper guide wheels 19A and the two second upper guide wheels 19B are in the upper position, one side of the slider 182 abuts against the upper stop member 183, so that the slider 182 can no longer move upwards. When the two first upper guide wheels 19A and the two second upper guide wheels 19B are in the lower position, one side of the slider 182 abuts against the lower stop member 184, so that the slider 182 can no longer move downwards. The upper stop member 183 mainly cooperates with the upper rail set to jointly limit the slider 182 located in the upper position. The lower stop member 184 mainly cooperates with the upper rail set to jointly limit the slider 182 located in the lower position.

It should be noted that, in this embodiment, each switching module 18 includes components such as inclined guide rails 181 and sliders 182, so that the upper guide wheels (the first upper guide wheel 19A or the second upper guide wheel 19B) can move between an upper position away from the body 11 and a lower position close to the body 11 along the inclined path P, but the components included in each of the switching modules 18 are not limited to the components described in this embodiment. As long as each of the switching modules 18 can be controlled by the control module 12 to move the upper guide wheels (the first upper guide wheel 19A or the second upper guide wheel 19B) between the upper position away from the body 11 and the lower position close to the body 11 along the inclined path P, should all belong to the applications of the switching module 18.

Back to FIG. 1 again, in practice, the overhead hoist transfer system further includes a plurality of identification units 200, which are disposed on the lower straight rail, or, disposed adjacent to the lower straight rail. The overhead hoist transfer 100 further includes at least one sensor (not shown) which disposed on the body 11. The sensor can sense adjacent identification units 200 and generate position information accordingly.

For example, in one of the embodiments, the identification unit 200 can be bar codes in various types and can be disposed on the lower straight rail. The sensor can be a barcode reader, of course, the identification unit 200 and the sensor are not limited thereto. In different embodiments, the identification unit 200 can also be smart tags in various types (such as RFID tags, NFC tags, etc.), so the sensor can correspondingly be a reader capable of reading smart tags. In different embodiments, the identification unit 200 can also be a reflective strip, a magnetic sensing member, etc., so the sensor can be correspondingly a beam emitter/receiver, a magnetic sensor, etc.

It should be noted that the drawings of this embodiment shows an example where the identification unit 200 is disposed on the lower straight rail, but the position of the identification unit 200 is not limited thereto. In practice, the identification unit 200 can also be independently disposed on a bracket of the lower straight rail and the upper rail set, and one end of the bracket is secured to the ceiling.

As previously described, each of the upper rail sets is adjacent to a branching gap. When the overhead hoist transfer 100 passes through the branching gap, the overhead hoist transfer 100 can go straight or turn. Thus, in practice, the control module 12 can determine whether the overhead hoist transfer 100 goes straight or turn when passing through the branching gap according to the transfer information and the position information to control the guide wheel moving device 17, allowing the switching module 18 to drive the upper guide wheel to move to the upper position or the lower position.

Specifically, when the control module 12 determines that the overhead hoist transfer 100 moves along a predetermined main moving path according to the transfer information, the control module 12 can control the switching module 18 located at the upper position or the lower position before the overhead hoist transfer 100 enters the predetermined main moving path. The control module 12 can no longer control the switching module 18 to actuate during the overhead hoist transfer 100 moving along the predetermined main moving path, so as to keep the upper guide wheel at the upper position or the lower position. During the movement of the overhead hoist transfer 100 along the predetermined main moving path, the overhead hoist transfer 100 may pass through at least one branching gap and at least one upper rail set.

In a preferred embodiment, when the two upper guide wheels (the first upper guide wheel 19A or the second upper guide wheel 19B) disposed on a same slider 182 are in the upper position or the lower position, the two upper guide wheels abut against one side of one of the upper turn rails, or the two upper guide wheels abut against one side of one of the upper straight rails, so that the body 11 is inclined accordingly, and the drive wheel (the first drive wheel 13 or the second drive wheel 14) of one of the drive wheel sets is in contact with adjacent lower straight rail or lower turn rail, that is, one of the drive wheels is lifted and suspended, so that the suspended drive wheel can cross the branching gap or the rail gap. Of course, when the body 11 is inclined and one of the drive wheels does not contact adjacent lower straight rail or lower turn rail, the other drive wheel is in contact with the adjacent lower straight rail or the lower turn rail, and the two lower guide wheels on a same side (the first lower guide wheel 15A or the second lower guide wheel 15B) can also abut against an inner side of the lower rail.

In practice, the predetermined main moving path may be designed by rail construction personnel according to the most frequently moving route of the overhead hoist transfer 100, and is not limited thereto. For example, it is assumed that the most frequently moving route of the overhead hoist transfer 100 in the factory is straight, the rail construction personnel can set the predetermined main moving path as straight, and design the upper rail and overhead hoist transfer according to the predetermined main moving path.

Figure 11:
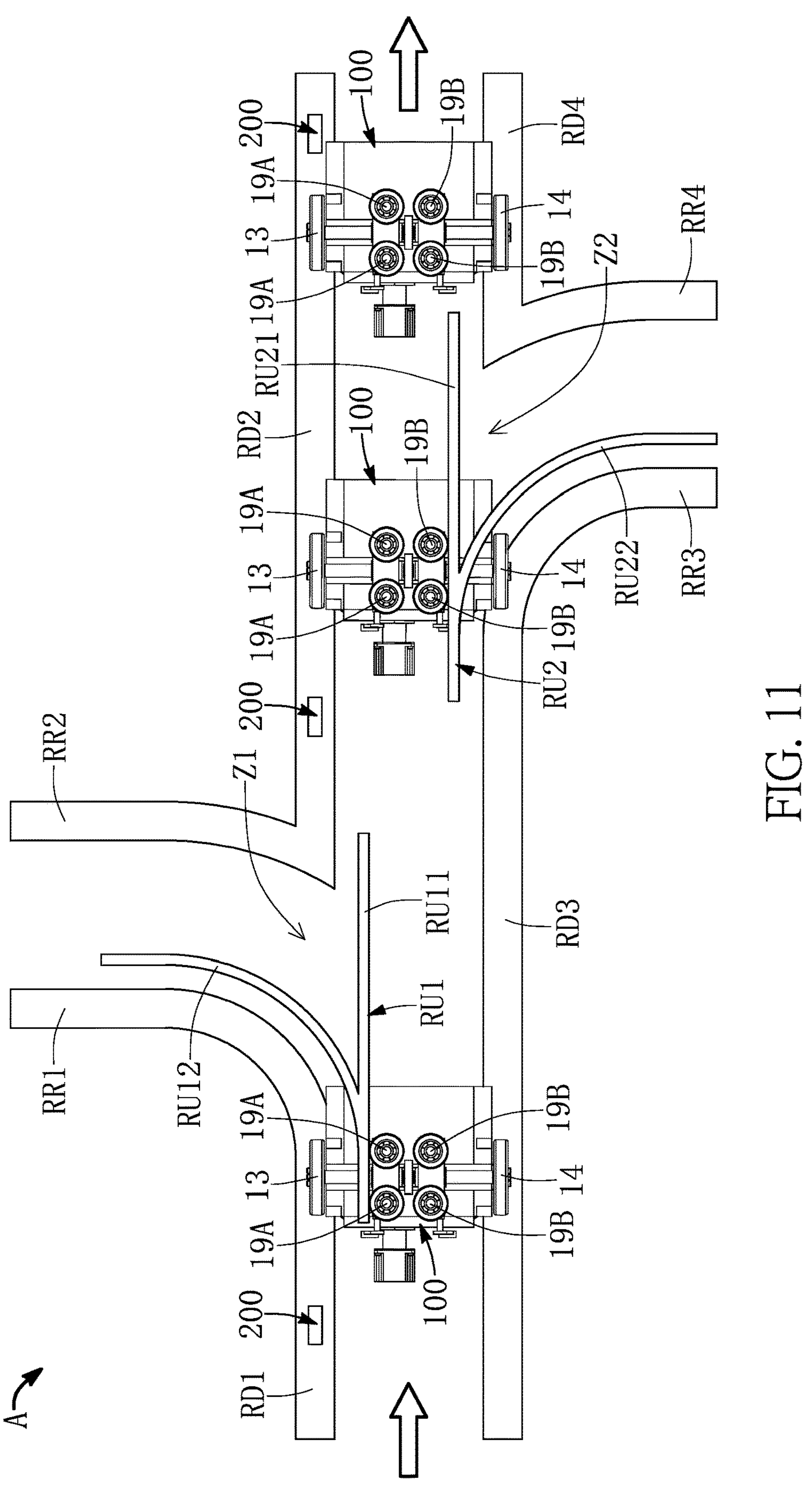
FIG. 11 is a schematic top view showing the straight-moving of the overhead hoist transfer of the overhead hoist transfer system according to the first embodiment of the present disclosure.
Figure 12:
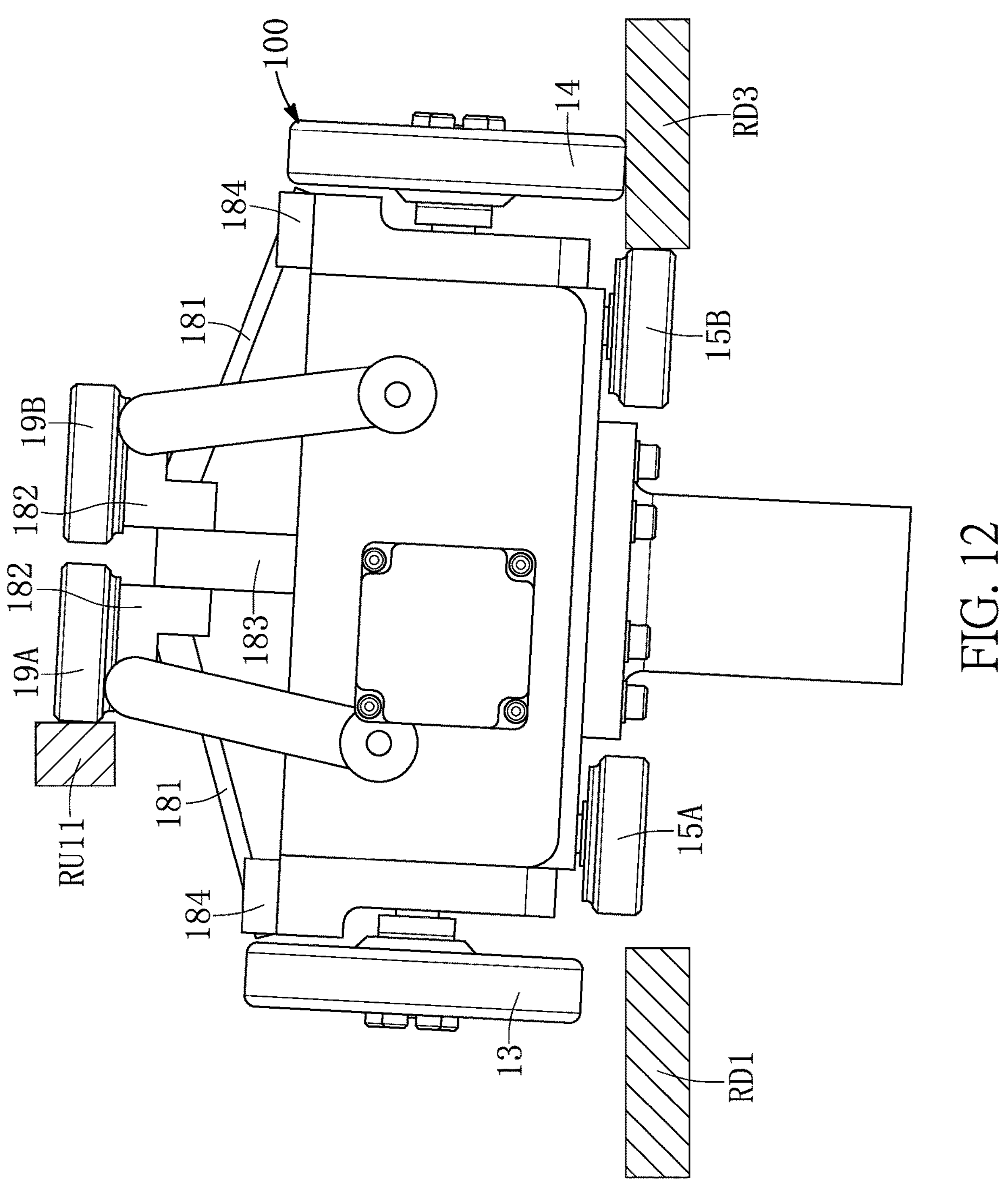
FIG. 12 and FIG. 13 are rear views of the overhead hoist transfer of the present disclosure in different states.
Figure 13:
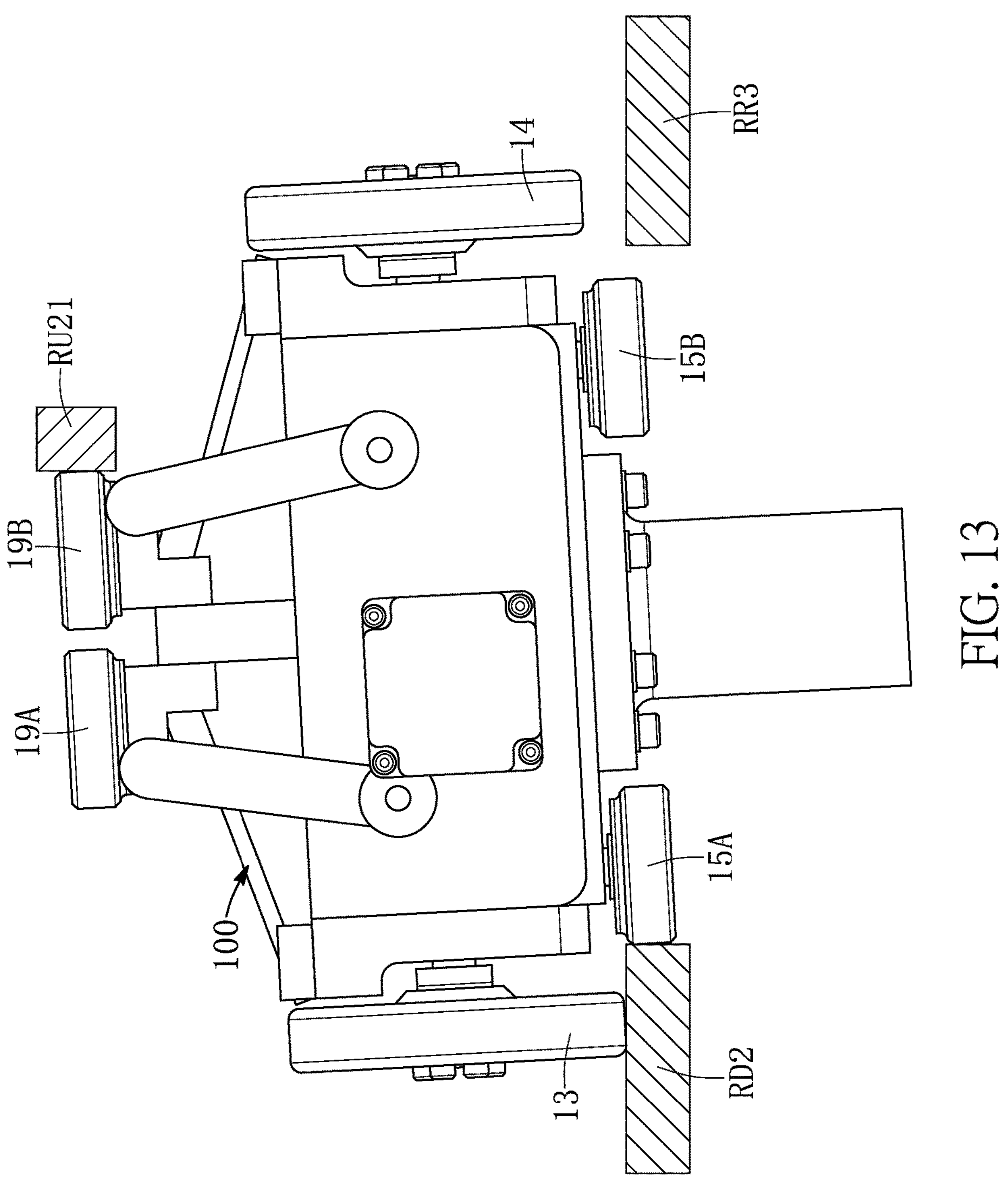

More specifically, reference is made to FIG. 1, FIG. 6, and FIG. 11 to FIG. 13. FIG. 11 is a schematic top view showing the straight-moving of the overhead hoist transfer of the overhead hoist transfer system according to the first embodiment of the present disclosure, and FIG. 12 and FIG. 13 are rear views of the overhead hoist transfer of the present disclosure in different states.

In FIG. 11, it is assumed that the predetermined main moving path is straight through the first upper rail set RU1 and the second upper rail set RU2, when the control module 12 determines that the overhead hoist transfer 100 has moved to a front of the first upper rail set RU1 according to the transfer information and position information, the control module 12 controls the guide wheel moving device 17, so that the two switching modules 18 can drive the two first upper guide wheels 19A and the two second upper guide wheels 19B to move to the upper position at the same time. During the overhead hoist transfer 100 moving along the predetermined main moving path (straight), the control module 12 no longer controls the guide wheel moving device 17, so that the two first upper guide wheels 19A and the two second upper guide wheels 19B can be continuously in the upper position. That is, before the overhead hoist transfer 100 passes through the first upper rail set RU1, the control module 12 controls the two first upper guide wheels 19A and the two second upper guide wheels 19B to be located at the upper position. During the overhead hoist transfer 100 passing through the first upper rail set RU1, before the overhead hoist transfer 100 passing through the second upper rail set RU2, and during the overhead hoist transfer 100 passing through the second upper rail set RU2, the two first upper guide wheels 19A and the two second upper guide wheels 19B remain in the upper position, so that the control module 12 can no longer control the guide wheel moving device 17. In this way, the overhead hoist transfer 100 can quickly pass through the first upper rail set RU1 and the second upper rail set RU2, achieving the efficiency of passing through multiple branching gaps at a relative high speed.

As shown in FIG. 12, when the overhead hoist transfer 100 passes through the first upper rail set RU1, the two first upper guide wheels 19A abut against a side surface of the first upper straight rail RU11, and the sliders 182 connected to the two first upper guide wheels 19A abut against the upper stop member 183, so that the overhead hoist transfer 100 is inclined to the right as shown in FIG. 12. Since the overhead hoist transfer 100 is inclined, the first drive wheel 13 is lifted, and the first drive wheel 13 and the first lower guide wheel 15A are not in contact with the adjacent first lower straight rail RD1. That is, the first drive wheel 13 and the first lower guide wheel 15A are suspended. On the contrary, the second drive wheel 14 and the second lower guide wheel 15B are in contact with the third lower straight rail RD3, and the overhead hoist transfer 100 moves on the third lower straight rail RD3 by the second drive wheel 14 and the second lower guide wheel 15B.

As shown in FIG. 11 and FIG. 12, during the overhead hoist transfer 100 passing through the first upper rail set RU1, the first drive wheel 13 is not in contact with the first lower straight rail RD1 since the overhead hoist transfer 100 is inclined, so that the first drive wheel 13 can cross the first branching gap Z1 accordingly. That is, through the design which the overhead hoist transfer 100 is inclined by making the first upper guide wheel 19A abut against the first upper straight rail RU11, the lifted first drive wheel 13 can cross the branching gap.

On the contrary, assuming that the overhead hoist transfer 100 is not inclined when passing through the first branching gap Z1, since a bottom of the first drive wheel 13 is not in contact with the first lower straight rail RD1, the overhead hoist transfer 100 will be suddenly inclined when passing through the branching gap Z1 without rails. Moreover, when the overhead hoist transfer 100 passes through the first branching gap Z1, since the bottom of the first drive wheel 13 is not in contact with the first lower straight rail RD1, there may also be a problem that the first drive wheel 13 cannot move to an upper surface of the second lower straight rail RD2 successfully. Therefore, through a design that makes the overhead hoist transfer 100 to cooperate with the upper rail set, the overhead hoist transfer 100 is inclined, allowing the drive wheels of the overhead hoist transfer 100 to cross the branching gaps.

As shown in FIG. 11 and FIG. 13, when the overhead hoist transfer 100 passes through the second upper rail set RU2, the two second upper guide wheels 19B abut against a side surface of the second upper straight rail RU21, and the overhead hoist transfer 100 is inclined to the left as shown in FIG. 13. When the overhead hoist transfer 100 is inclined to the left, the second drive wheel 14 is lifted and is not contacting the third lower straight rail RD3, and the first drive wheel 13 and the first lower guide wheel 15A are in contact with the second lower straight rail RD2. The overhead hoist transfer 100 then advances along the second lower straight rail RD2 by the first drive wheel 13 and the first lower guide wheel 15A. When the overhead hoist transfer 100 is inclined as shown in FIG. 13 and passes through the second upper rail set RU2, the second drive wheel 14 can cross the second branching gap Z2.

According to the above description, before the overhead hoist transfer 100 moves straight ahead along the predetermined main moving path, the control module 12 only needs to control the two first upper guide wheels 19A and the two second upper guide wheels 19B to move to the upper position. Then, no matter how many upper rail sets the overhead hoist transfer 100 passes through, the control module 12 can no longer change the positions of the two first upper guide wheels 19A and the two second upper guide wheels 19B. In this way, when the overhead hoist transfer 100 moves straight along the predetermined main moving path, the overhead hoist transfer 100 can move forward at a relatively high speed, thereby effectively improving the transfer efficiency of the overhead hoist transfer system.

It should be noted that this embodiment takes the overhead hoist transfer 100 passing through two upper rail sets at different sides as an example during the overhead hoist transfer 100 moving straight along the predetermined main moving path. However, during the overhead hoist transfer 100 moving straight along the predetermined main moving path, the number of upper rail sets it passes through and whether the plurality of upper rail sets are located on different sides can be changed according to actual requirements. For example, in one variation of this embodiment, during the overhead hoist transfer 100 moving straight along the predetermined main moving path, all the upper rail sets passed by the overhead hoist transfer 100 can be located on the same side, or a part of the upper rail sets are on the same side, and a part of the upper rail sets are on different sides.

Besides, it is worth mentioning that the first upper rail set RU1 is only disposed adjacent to the first branching gap Z1, and the second upper rail set RU2 is only disposed adjacent to the second branching gap Z2. Therefore, the overhead hoist transfer 100 is inclined only when passes through the first upper rail set RU1 and the second upper rail set RU2, and the overhead hoist transfer 100 is not inclined when moves without passing through the upper rail set. In other words, as shown in FIG. 11, when the overhead hoist transfer 100 passes through the first upper rail set RU1, the overhead hoist transfer 100 is inclined, so that the first drive wheel 13 can cross the first branching gap Z1. After the overhead hoist transfer 100 passes through the first upper rail set RU1, the overhead hoist transfer 100 is longer inclined, so the first drive wheel 13 is in contact with the second lower straight rail RD2. When the overhead hoist transfer 100 passes through the second upper rail set RU2, the overhead hoist transfer 100 is inclined again, so that the second drive wheel 14 can cross the second branching gap Z2 accordingly. After the overhead hoist transfer 100 passes through the second upper rail set RU2, the overhead hoist transfer 100 is no longer inclined, so that the second drive wheel 14 abuts against the fourth lower straight rail RD4.

Figure 14:
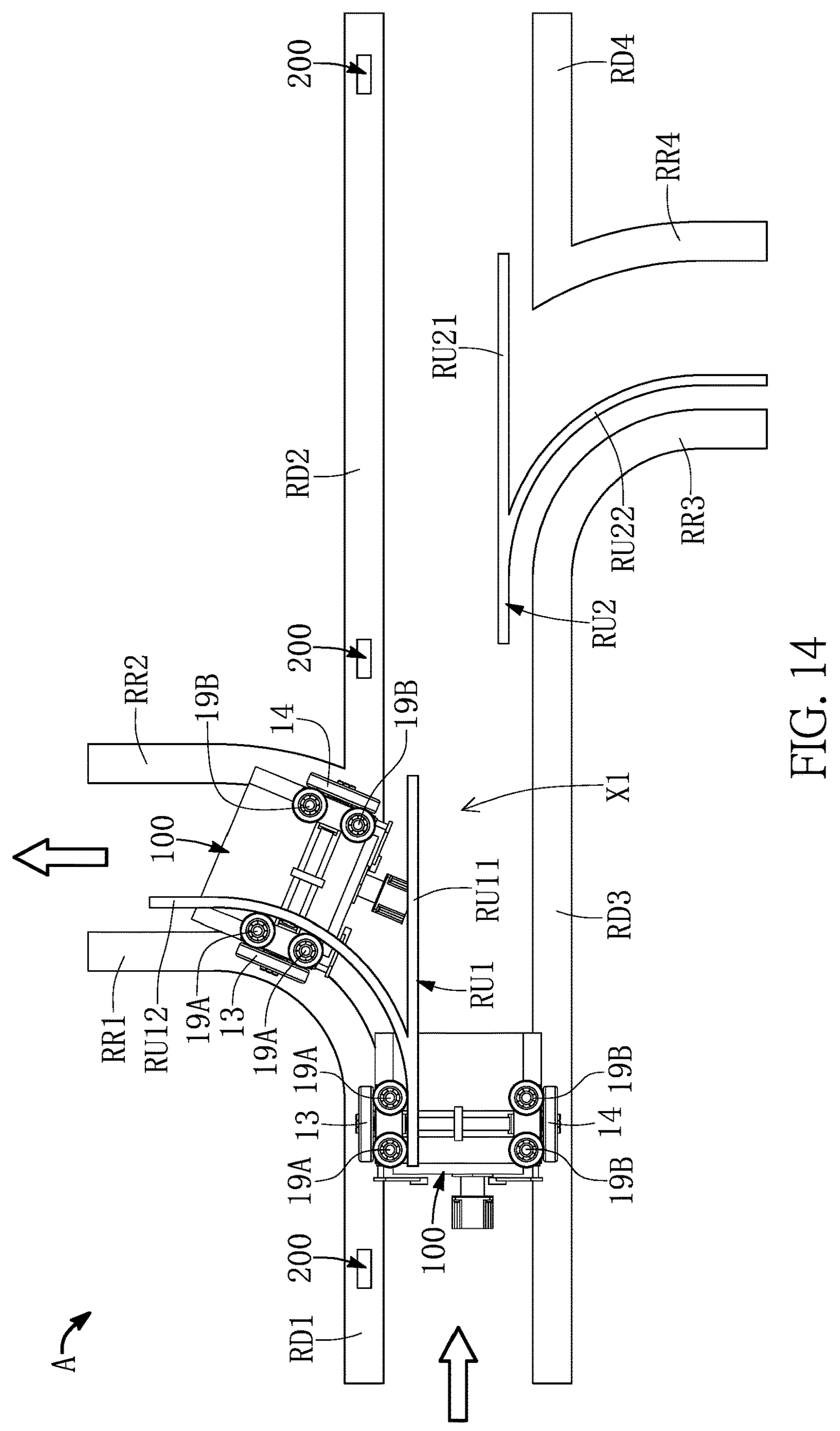
FIG. 14 is a schematic top view showing the turning of the overhead hoist transfer of the overhead hoist transfer system according to the first embodiment of the present disclosure.
Figure 15:
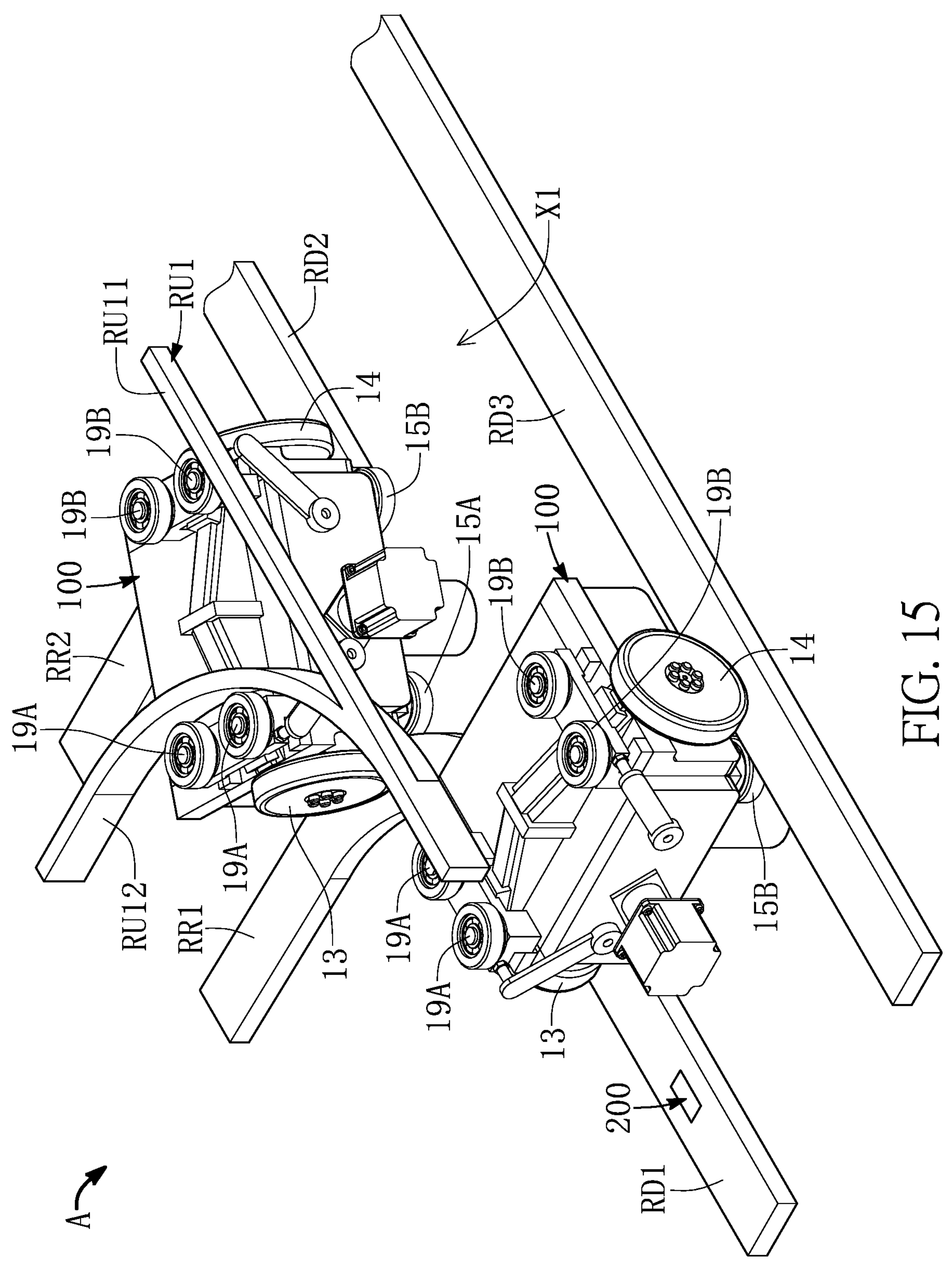
FIG. 15 is a side view showing the turning of the overhead hoist transfer of the overhead hoist transfer system according to the first embodiment of the present disclosure.
Figure 16:
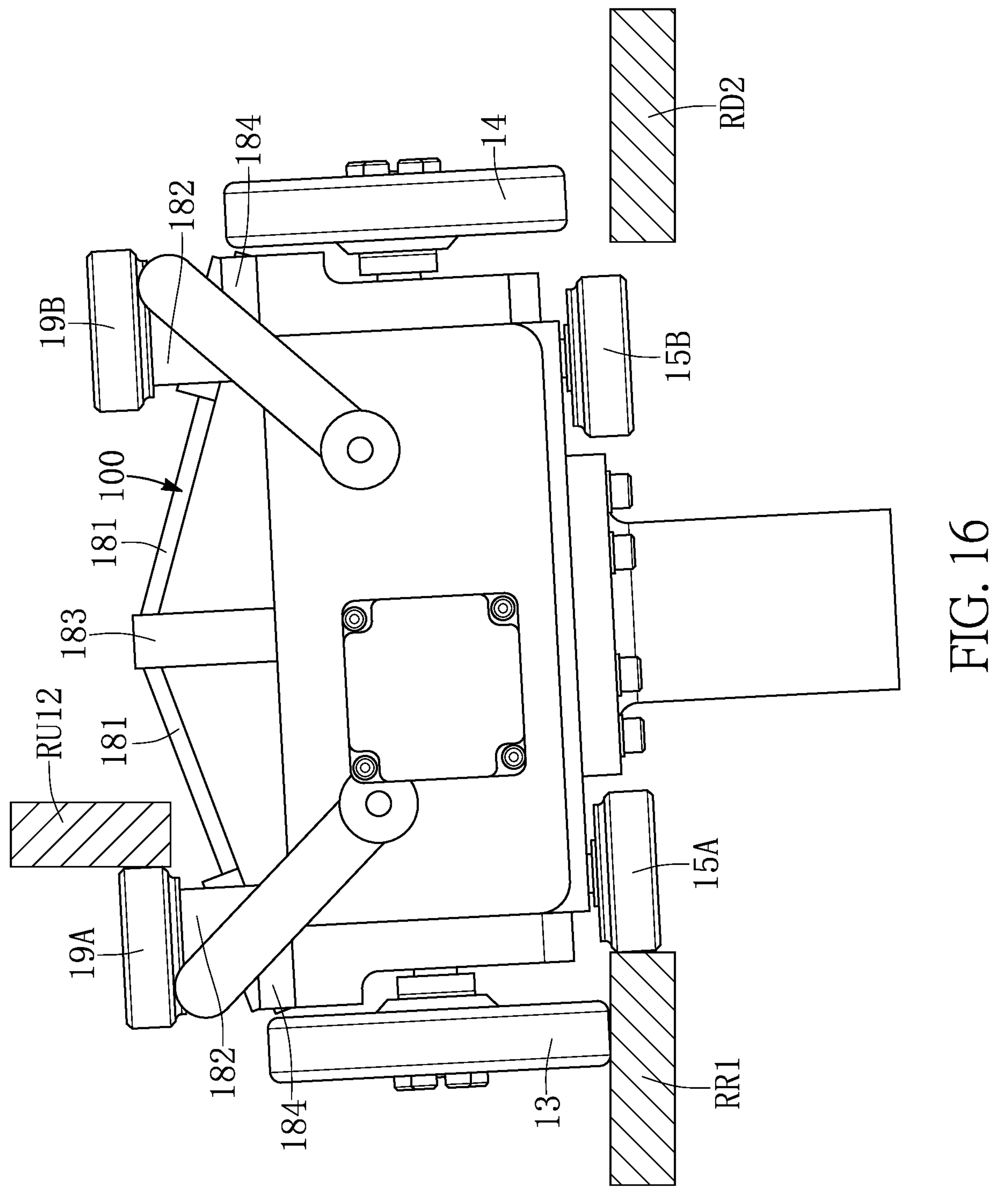
FIG. 16 is a rear view showing the turning of the overhead hoist transfer of the overhead hoist transfer system according to the first embodiment of the present disclosure.

Reference is made to FIG. 1, FIG. 6, and FIG. 14 to FIG. 16. FIG. 14 is a schematic top view showing the turning of the overhead hoist transfer of the overhead hoist transfer system according to the first embodiment of the present disclosure. FIG. 15 is a schematic view showing the turning of the overhead hoist transfer of the overhead hoist transfer system according to the first embodiment of the present disclosure. FIG. 16 is a rear view showing the turning of the overhead hoist transfer of the overhead hoist transfer system according to the first embodiment of the present disclosure.

In continuation of the embodiment described in FIG. 11 above, assuming that the predetermined main movement path is straight, when the control module 12 determines that the overhead hoist transfer 100 needs to turn when passing through the first upper rail set RU1 according to the transfer information, and when the control module 12 determines that the overhead hoist transfer 100 is about to pass the first upper rail set RU1 according to the position information, the control module 12 controls the guide wheel moving device 17, allowing the two first upper guide wheels 19A and the two second upper guide wheels 19B at the lower position at the same time.

As shown in FIG. 14 to FIG. 16, when the control module 12 allows the two first upper guide wheels 19A and the two second upper guide wheels 19B all be located at the lower position, when the overhead hoist transfer 100 passes through the first upper rail set RU1, the first upper guide wheel 19A abuts against a side surface of the first upper turn rail RU12, and the slider 182 having the first upper guide wheel 19A abuts against the adjacent lower stop member 184. Therefore, due to the relative positions among the first upper guide wheel 19A, the slider 182, the lower stop member 184, and the first upper turn rail RU12, the overhead hoist transfer 100 is inclined leftward as shown in FIG. 16. The second drive wheel 14 and the second lower guide wheel 15B are not in contact with the third lower straight rail RD3, and are suspended. The first drive wheel 13 and the first lower guide wheel 15A abut against the first lower straight rail RD1 and the first lower turn rail RR1 in order.

As mentioned above, in the case where the two first upper guide wheels 19A abut against a side surface of the first upper turn rail RU12, and the overhead hoist transfer 100 is inclined, the overhead hoist transfer 100 turns along the first upper turn rail RU12 and the first lower turn rail RR1, and during the turning of the overhead hoist transfer 100, the lifted second drive wheel 14 crosses the first rail gap X1 between the third lower straight rail RD3 and the second lower straight rail RD2.

As shown in FIG. 14 and FIG. 16, when the overhead hoist transfer 100 is turning through the first upper rail set RU1, the overhead hoist transfer 100 continues to be inclined, so that the second drive wheel 14 can cross the first rail gap X1. When the overhead hoist transfer 100 passes through the first upper rail set RU1, the overhead hoist transfer 100 is no longer inclined, so that the second drive wheel 14 of the overhead hoist transfer 100 is in contact with the second lower turn rail RR2.

It is worth mentioning that, as shown in FIG. 3 and FIG. 6, since the first height H1 is greater than the second height H2, during the overhead hoist transfer 100 turning along the first upper rail set RU1, the two second upper guide wheels 19B pass under the first upper straight rail RU11, while the two second upper guide wheels 19B are not in contact with the first upper straight rail RU11.

In the prior art, assuming that the speed of the overhead hoist transfer is 1 m/s when going straight, the speed of the overhead hoist transfer may be reduced to 0.4 m/s~0.5 m/s before turning, so that the control module of the overhead hoist transfer can control the action of the components for turning in real time, and reduce the speed difference between the two drive wheels on the inside of the overhead hoist transfer and on the outside of the overhead hoist transfer. In this way, the overhead hoist transfer can smoothly turn.

In contrary, since the overhead hoist transfer 100 of the overhead hoist transfer system of the present disclosure is inclined during the turning, and the drive wheel on one side of the overhead hoist transfer 100 is not in contact with the adjacent lower straight rail or lower turn rail, assuming that the speed of the overhead hoist transfer 100 is 1 m/s when going straight, the overhead hoist transfer 100 can still turn at a speed of 0.75 m/s~1 m/s. Thus, compared with the above-mentioned conventional overhead hoist transfer, the overhead hoist transfer of the present disclosure can turn at a relatively higher speed, so that the present disclosure presents improved transfer efficiency than that of the prior art.

Figure 17:
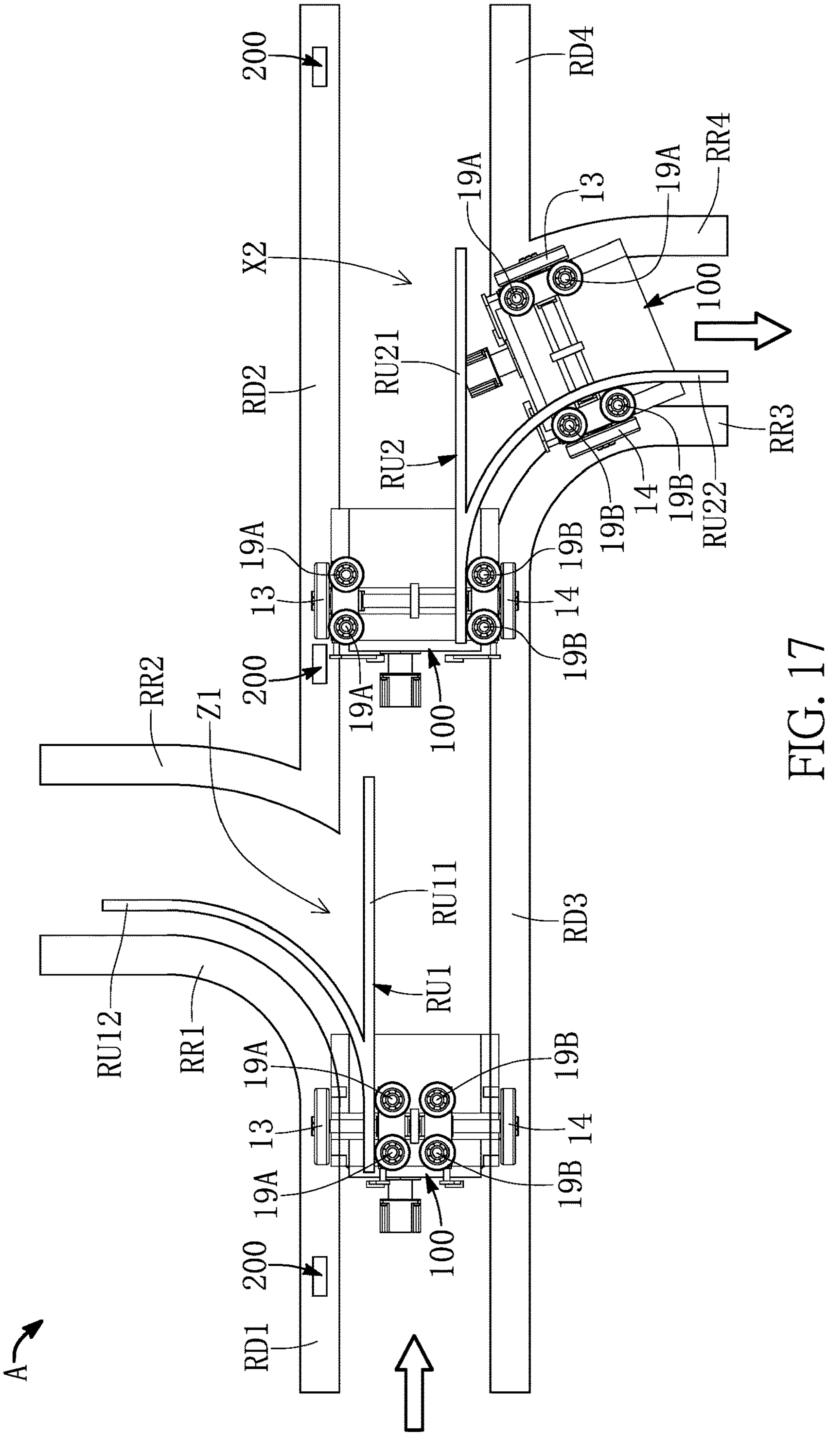
FIG. 17 is a schematic top view showing the straight-moving followed by turning of the overhead hoist transfer of the overhead hoist transfer system according to the first embodiment of the present disclosure.
Figure 18:
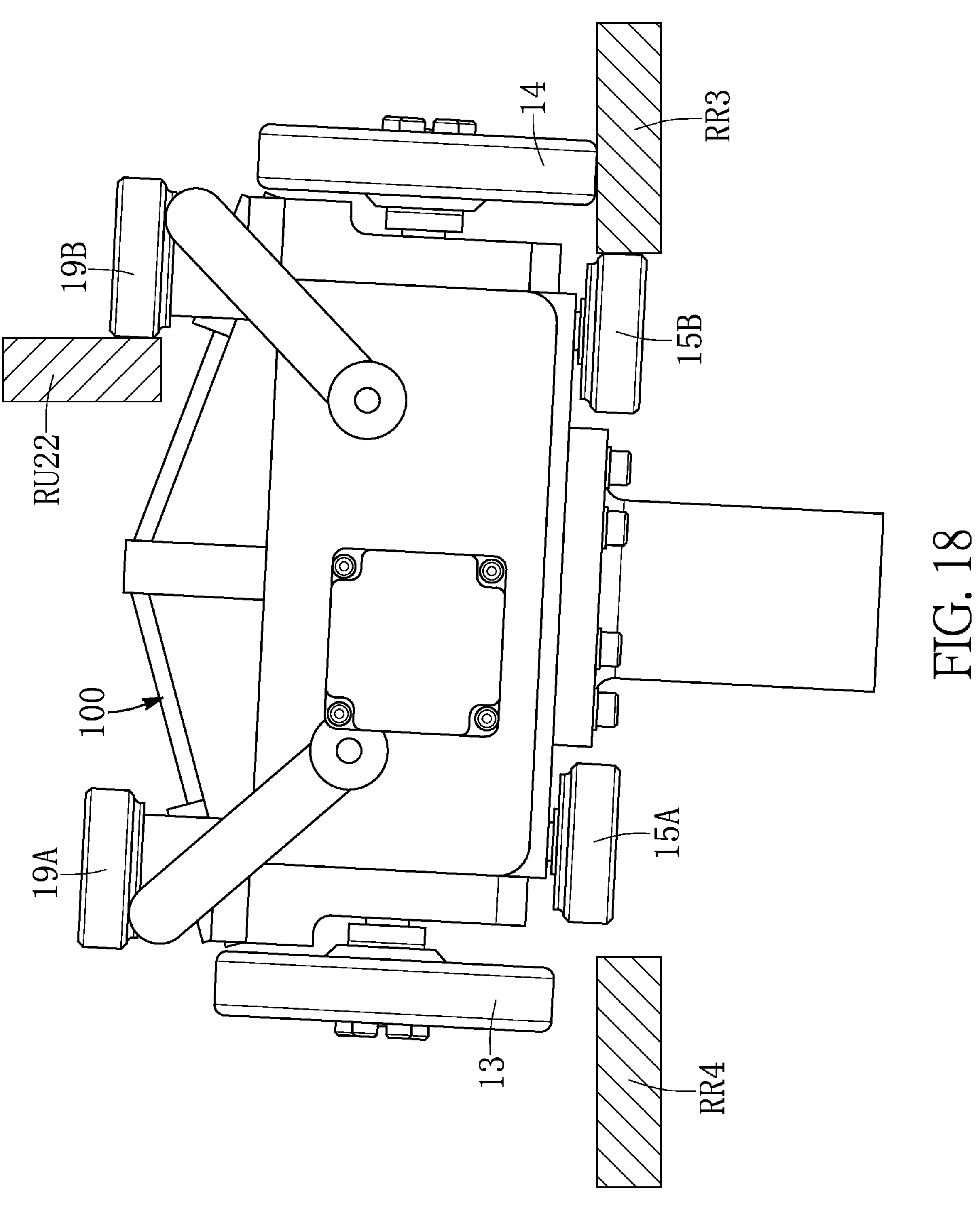
FIG. 18 is a rear view showing the turning of the overhead hoist transfer of the overhead hoist transfer system according to the first embodiment of the present disclosure.

Reference is made to FIG. 17 and FIG. 18, FIG. 17 is a schematic top view showing the straight-moving followed by turning of the overhead hoist transfer of the overhead hoist transfer system according to the first embodiment of the present disclosure. FIG. 18 is a rear view showing the turning of the overhead hoist transfer. In continuation of the embodiment described in FIG. 11, assuming that the predetermined main moving path is straight, when the control module 12 determines that the overhead hoist transfer 100 needs to go straight when passing through the first upper rail set RU1 and needs to turn when passing through the second upper rail set RU2 according to the transfer information, the control module 12 controls the guide wheel moving device 17 to allow the two first upper guide wheels 19A and the two second upper guide wheels 19B to be in the upper position at the same time when the control module 12 determines that the overhead hoist transfer 100 is about to pass the first upper rail set RU1 according to the position information. So that the overhead hoist transfer 100 moves straight when passing through the first upper rail set RU1.

After the overhead hoist transfer 100 passes through the first upper rail set RU1, and when the control module 12 determines that the overhead hoist transfer 100 is about to pass through the second upper rail set RU2 according to the position information, the control module 12 controls the guide wheel moving device 17, allowing the two first upper guide wheels 19A and the two second upper guide wheels 19B moving from the upper position to the lower position.

In the case where the two first upper guide wheels 19A and the two second upper guide wheels 19B are moved to the lower position, when the overhead hoist transfer 100 passes through the second upper rail set RU2, the two second upper guide wheels 19B abut against a side surface of the second upper turn rail RU22, the overhead hoist transfer 100 is inclined, and the first drive wheel 13 and the first lower guide wheel 15A are not in contact with the second lower straight rail RD2. The first drive wheel 13 is then suspended, and the second drive wheel 14 and the second lower guide wheel 15B abut against the third lower straight rail RD3 and the third lower turn rail RR3 in order. So that the overhead hoist transfer 100 turns along the third lower turn rail RR3 and the second upper rail set RU2.

When the overhead hoist transfer 100 passes through the second upper rail set RU2, the first drive wheel 13 crosses a second rail gap X2 between the second lower straight rail RD2 and the fourth lower straight rail RD4 since first drive wheel 13 is suspended.

According to the above description, simply put, in the case that the predetermined main moving path is straight, when the control module 12 determines that the overhead hoist transfer 100 needs to turn when passing through a certain upper rail set, the control module 12 controls the guide wheel moving device 17 to allow the four upper guide wheels to change their positions before the overhead hoist transfer 100 is about to turn according to the transfer information and position information. So that the overhead hoist transfer 100 initially going straight can turn along the adjacent lower turn rail and upper rail set when passes through the next upper rail set.

In addition, in the prior art, when the moving path of the overhead hoist transfer is straight first and then turn, when the overhead hoist transfer is going straight at a speed of 1 m/s, the speed of the overhead hoist transfer must be reduced to 0.5 m/s before turning to allow the relevant components to have enough time to actuate before turning for the overhead hoist transfer to turn successfully. Besides, before the overhead hoist transfer of the prior art turns, the actuation of related components causes vibration of the overhead hoist transfer, affecting the stability of the transferring of the overhead hoist transfer.

In the present disclosure, during the transferring of the overhead hoist transfer 100 along the predetermined main moving path (going straight then turning), the control module 12 does not control the guide wheel moving device 17 to actuate, so that the overhead hoist transfer 100 can go straight along the predetermined main moving path at a speed of 1 m/s and then turn, and the overhead hoist transfer 100 does not need to reduce the speed before turning or during turning. So that the overhead hoist transfer 100 of the present disclosure presents higher transfer efficiency than the conventional overhead hoist transfer. In addition, since the control module 12 does not control the guide wheel moving device 17 to actuate during the transferring of the overhead hoist transfer 100 of the present disclosure along the predetermined main moving path (going straight then turning), the vibration that happens in the above-mentioned prior overhead hoist transfer will not appear in the overhead hoist transfer 100 of the present disclosure.

It is worth mentioning that in FIG. 17 takes the overhead hoist transfer 100 going straight through the first upper rail set RU1 followed by turning along the second upper rail set RU2 as an example, but the overhead hoist transfer 100 can also move in reverse. That is, the two first upper guide wheels 19A and the two second upper guide wheels 19B of the overhead hoist transfer 100 can be located in the lower position first to allow the overhead hoist transfer 100 to turn along the second upper rail set RU2, then the control module 12 controls the two first upper guide wheels 19A and the two second upper guide wheels 19B moving to the upper position, so that the overhead hoist transfer 100 passes through the first upper rail set RU1 straightly.

Figure 19:
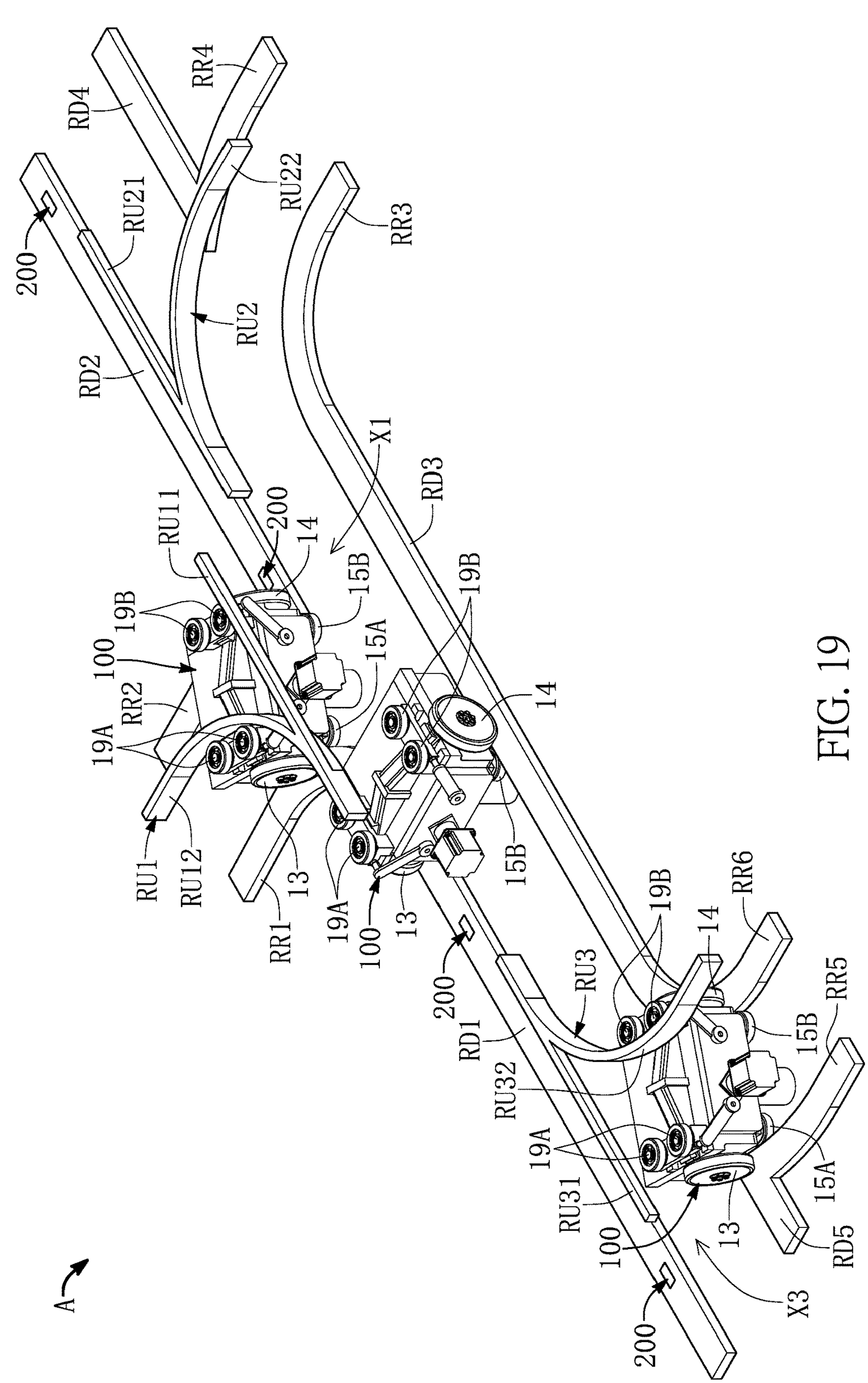
FIG. 19 is a schematic perspective view of the overhead hoist transfer of the overhead hoist transfer system according to the first embodiment of the present disclosure moving straight after turning into a straight rail and then turning again.
Figure 20:
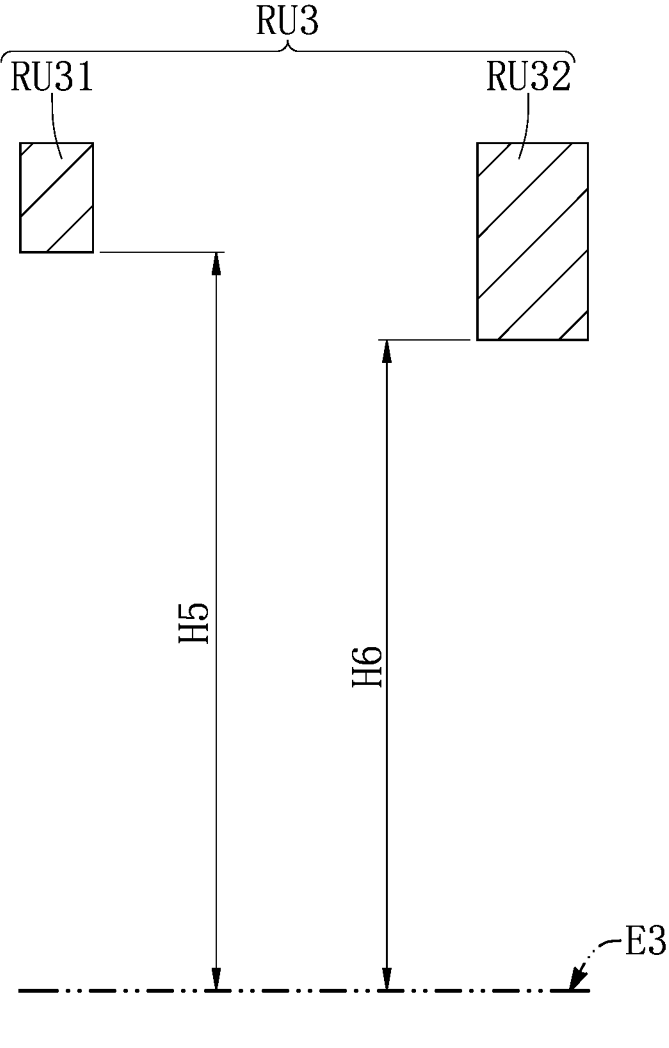
FIG. 20 is a schematic cross-sectional view of a third upper straight rail and a third upper turn rail of a third upper rail set of the overhead hoist transfer system according to the first embodiment of the present disclosure.
Figure 21:
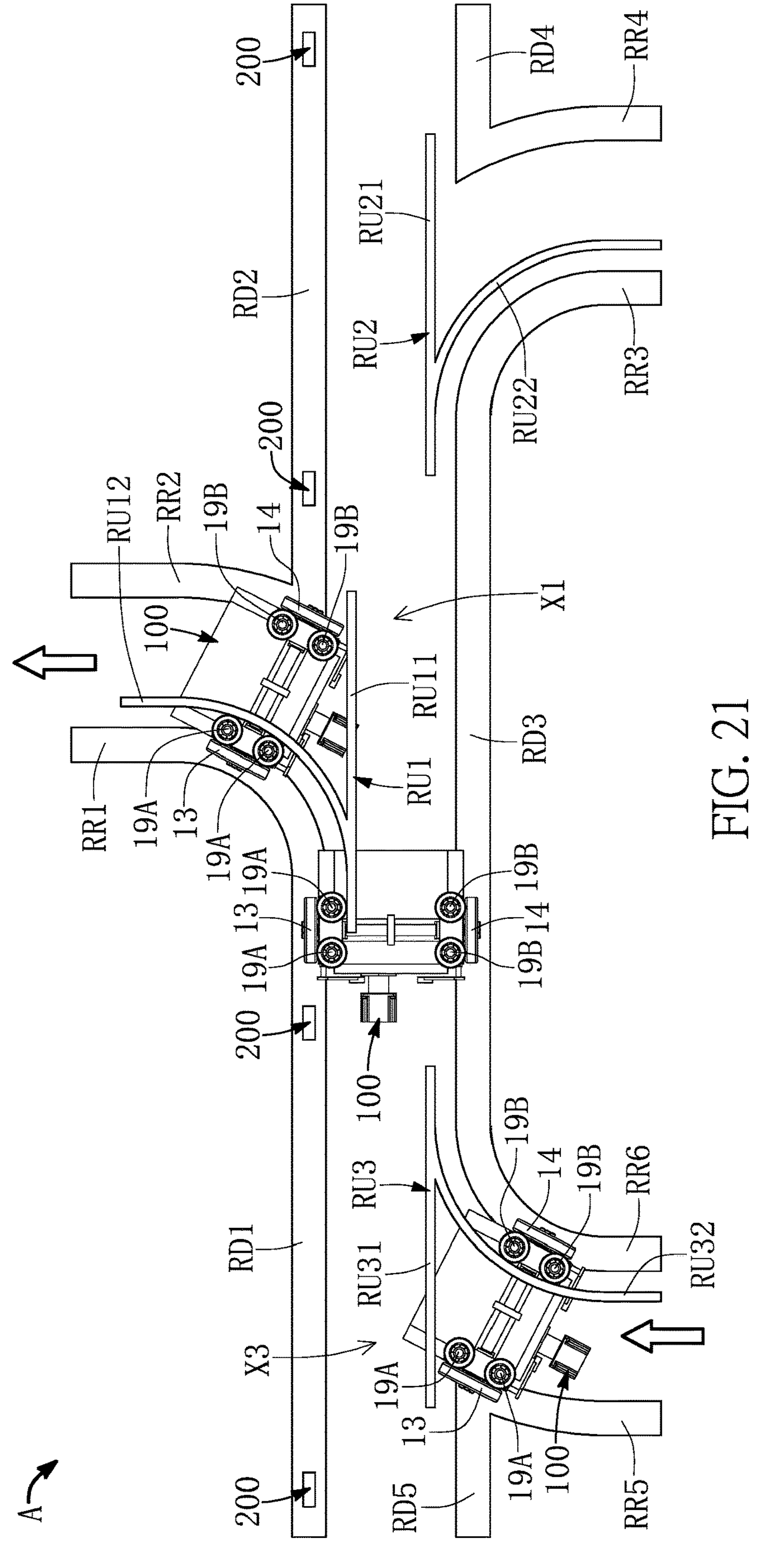
FIG. 21 is a schematic top view of the overhead hoist transfer of the overhead hoist transfer system according to the first embodiment of the present disclosure moving straight after turning into a straight rail and then turning again.

Reference is made to FIG. 6 and FIG. 19 to FIG. 21. FIG. 19 is a schematic perspective view of the overhead hoist transfer of the overhead hoist transfer system according to the first embodiment of the present disclosure moving straight after turning into a straight rail and then turning again. FIG. 20 is a schematic cross-sectional view of a third upper straight rail and a third upper turn rail of a third upper rail set of the overhead hoist transfer system according to the first embodiment of the present disclosure. FIG. 21 is a schematic top view of the overhead hoist transfer of the overhead hoist transfer system according to the first embodiment of the present disclosure moving straight after turning into a straight rail and then turning again.

The difference between this embodiment and that shown in FIG. 11 is that this embodiment further includes a fifth lower straight rail RD5, a fifth lower turn rail RR5, and a sixth lower turn rail RR6. One end of the fifth lower straight rail RD5 is connected to the fifth lower turn rail RR5, one end of the third lower straight rail RD3 is connected to the sixth lower turn rail RR6, and one end of the fifth lower straight rail RD5 connected to the fifth lower turn rail RR5 and one end of the third lower straight rail RD3 connected to the sixth lower turn rail RR6 form a branching gap.

Compared with the embodiment shown in FIG. 11, this embodiment further includes a third upper rail set RU3. The third upper rail set RU3 includes a third upper straight rail RU31 and a third upper turn rail RU32. A straight distance between a lower edge of the third upper straight rail RU31 and a plane E3 where the adjacent third lower straight rail RD3 is located is defined as a fifth height H5. A straight distance between a lower edge of the third upper turn rail RU32 and the plane E3 is defined as a sixth height H6. The fifth height H5 is greater than the sixth height H6, and a surface on which the drive wheel moves on the third lower straight rail RD3 is located on a same plane as the plane E3.

In continuation of the embodiment described in FIG. 11 above, assuming that the predetermined main movement path is straight, when the control module 12 determines that the overhead hoist transfer 100 turns along the third upper rail set RU3 followed by going straight for a distance then turns again along the first upper rail set RU1 according to the transfer information, the control module 12 controls the guide wheel moving device 17 to allow the two first upper guide wheels 19A and the two second upper guide wheels 19B to be positioned at the lower position at the same time before the overhead hoist transfer 100 passes through the third upper rail set RU3. So that during the overhead hoist transfer 100 passing through the third upper rail set RU3, the two second upper guide wheels 19B abut against a side surface of the third upper turn rail RU32 to make the overhead hoist transfer 100 turns.

During the turning of the overhead hoist transfer 100 along the third upper rail set RU3, the overhead hoist transfer 100 is inclined, and the first drive wheel 13 is suspended. Thereby, the first drive wheel 13 can cross a third rail gap X3 between the first lower straight rail RD1 and the fifth lower straight rail RD5.

When the control module 12 determines that the straight-moving distance is shorter than a predetermined distance according to the transfer information, after the overhead hoist transfer 100 passes through the third upper rail set RU3, the control module 12 can no longer control the two first upper guide wheels 19A and the two second upper guide wheels 19B to change their positions, keeping the two first upper guide wheels 19A and the two second upper guide wheels 19B in the lower position. After the overhead hoist transfer 100 passes through the third upper rail set RU3 and then moves in a straight distance, the two first upper guide wheels 19A abut against a side surface of the first upper turn rail RU12, so that the overhead hoist transfer 100 is able to turn along the first upper rail set RU1.

That is, when the overhead hoist transfer 100 turns along the third upper rail set RU3 and goes straight for a certain distance then turning again along the first upper rail set RU1, the control module 12 only needs to control the guide wheel moving device 17 before the overhead hoist transfer 100 passes through the third upper rail set RU3, so that each of the upper guide wheels is in the lower position. After that, the control module 12 may not control each of the upper guide wheels to change their position until the overhead hoist transfer 100 completely passing through the first upper rail set RU1.

It should be noted that in the case that the overhead hoist transfer 100 does not pass through the upper rail set, the overhead hoist transfer 100 mainly moves on the lower straight rail through two drive wheels. Therefore, in the same situation, the moving of the overhead hoist transfer 100 on the lower straight rail is not affected when each of the upper guide wheels is in the upper position or the lower position. That is, the aforementioned predetermined distance may be set according to actual requirements.

In addition, only when passes through the upper rail set, the overhead hoist transfer 100 is inclined. After passing through the upper rail set, the overhead hoist transfer 100 is no longer inclined. Each of the drive wheels of the overhead hoist transfer 100 is in contact with the adjacent lower straight rail, so that the overhead hoist transfer 100 can move along the lower straight rail through the drive wheels.

According to the above description, simply put, when the predetermined main movement path is turning in followed by going straight then turning again, during the overhead hoist transfer 100 going multiple turns, the control module 12 may not control any of the upper guide wheels to change their positions. The control module 12 only controls at least one upper guide wheel to be in the upper position or the lower position before the overhead hoist transfer 100 turns along the first upper rail set.

In the prior art, when the overhead hoist transfer is turning in followed by going straight then turning again, the overhead hoist transfer needs to repeatedly switch related components. Thereby, the overhead hoist transfer must slow down severely, otherwise the overhead hoist transfer will not be able to turn in followed by going straight then turn again without obstruction. In contrast, the overhead hoist transfer of the present disclosure can move in the same route at a relatively rapid speed, so that the overhead hoist transfer of the present disclosure presents greater transferring efficiency compared with the overhead hoist transfer of the prior art.

Second Embodiment

Figure 22:
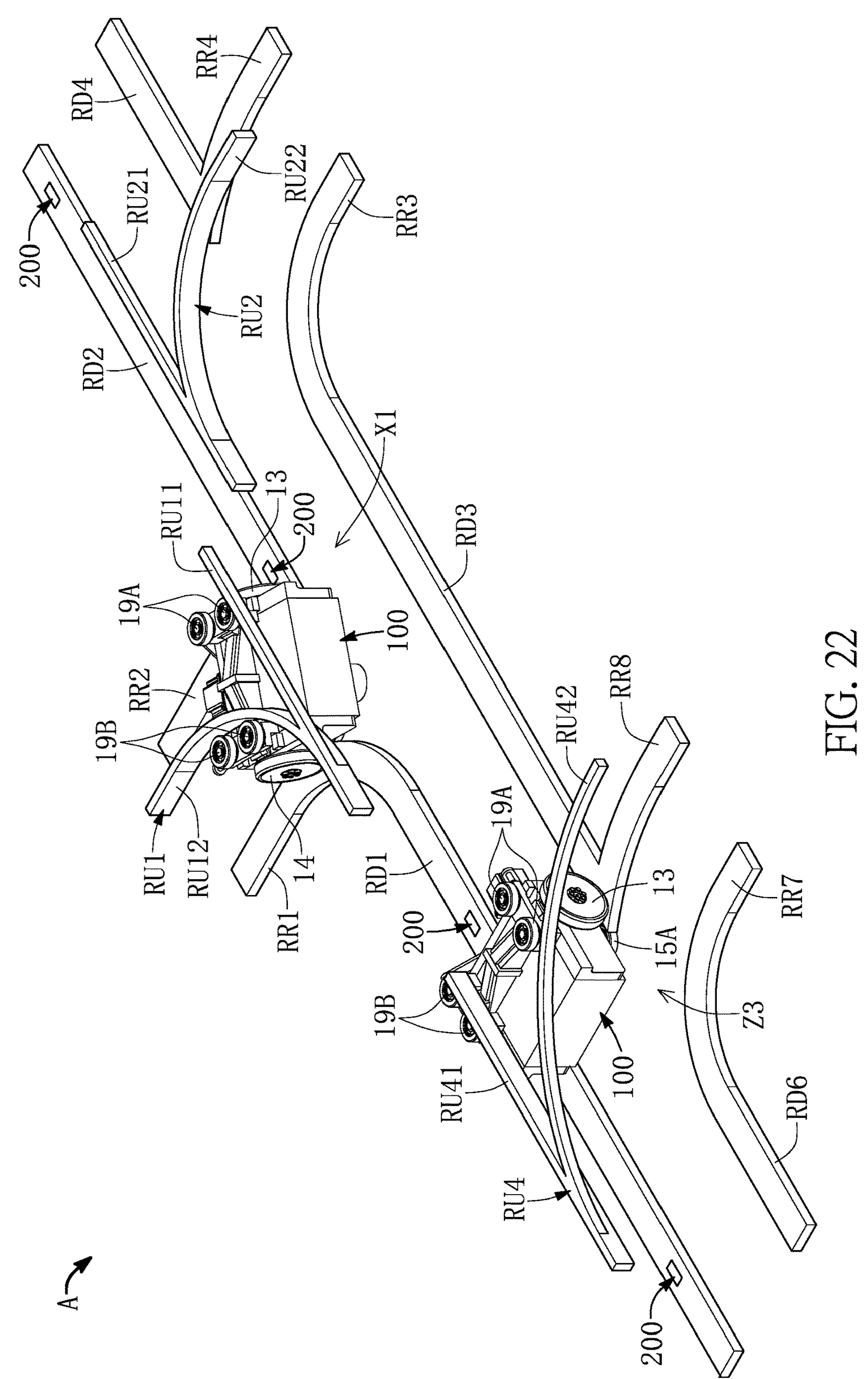
FIG. 22 is a schematic perspective view of the overhead hoist transfer system according to a second embodiment of the present disclosure.
Figure 23:
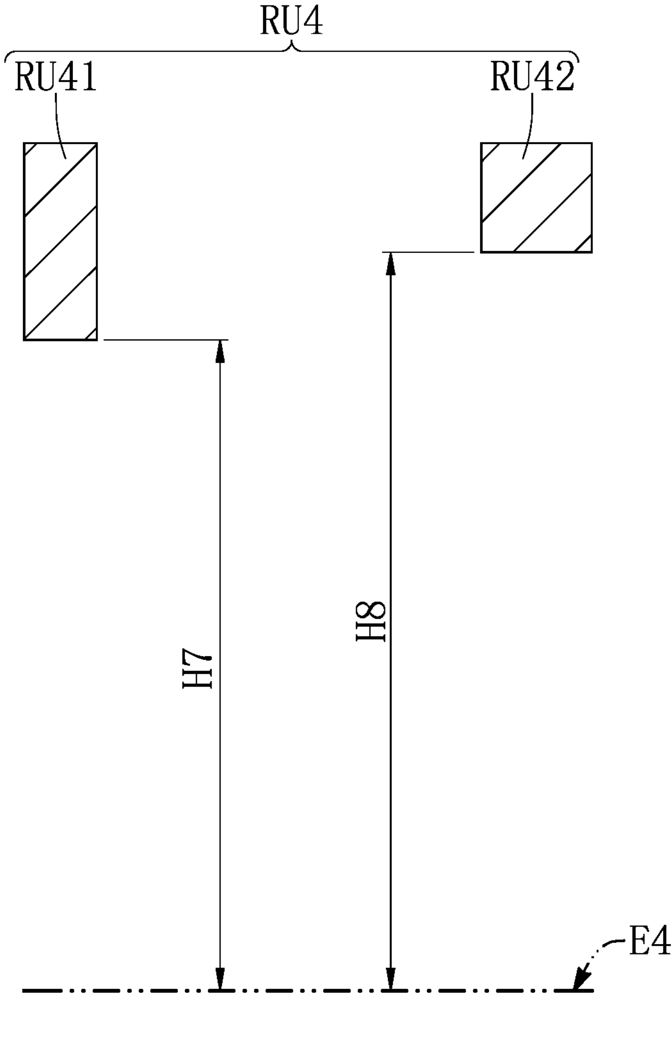
FIG. 23 is a schematic cross-sectional view of a fourth upper straight rail and a fourth upper turn rail of a fourth upper rail set of the overhead hoist transfer system according to the second embodiment of the present disclosure.
Figure 24:
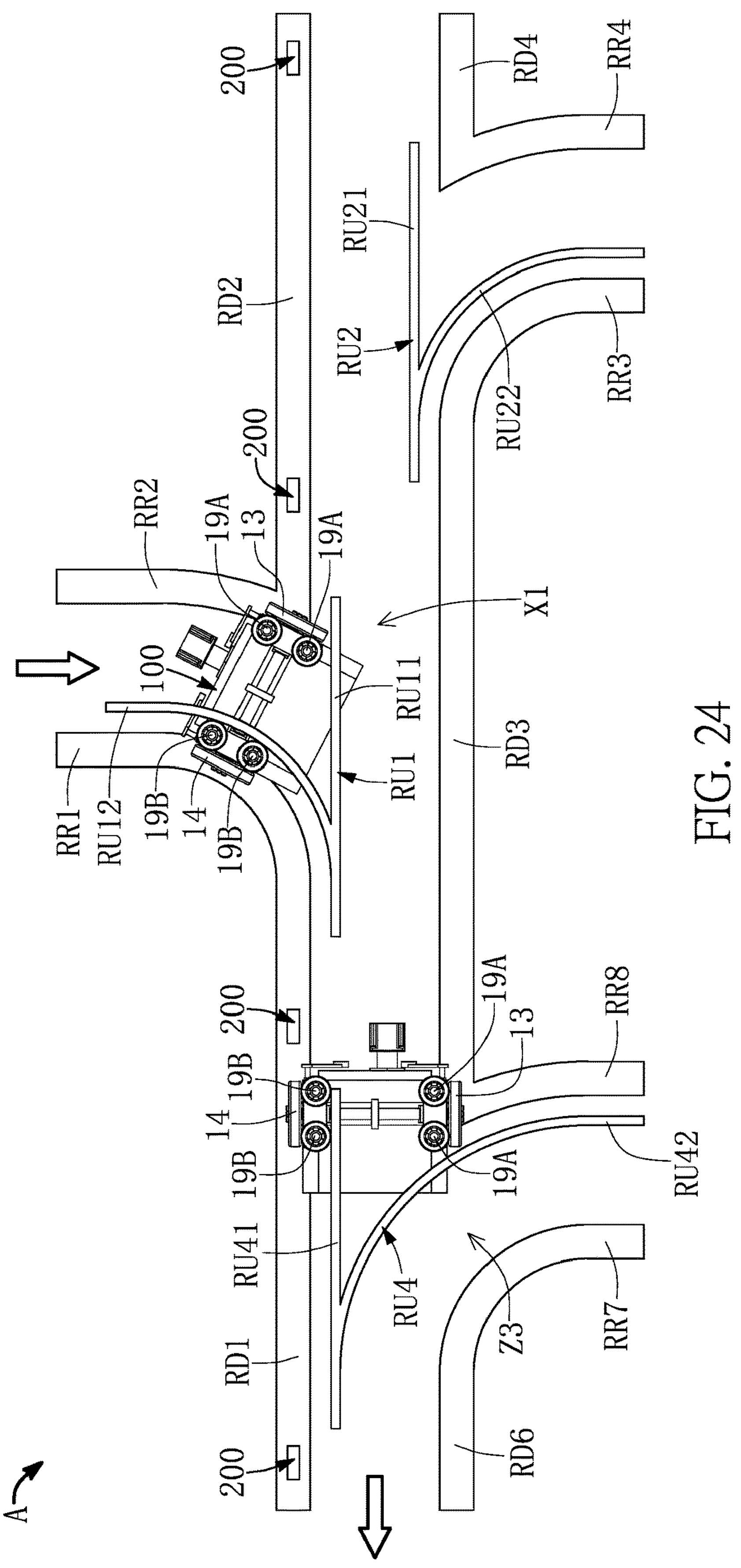
FIG. 24 is a top view showing the straight-moving after turning into a straight rail of the overhead hoist transfer of the overhead hoist transfer system according to the second embodiment of the present disclosure.
Figure 25:
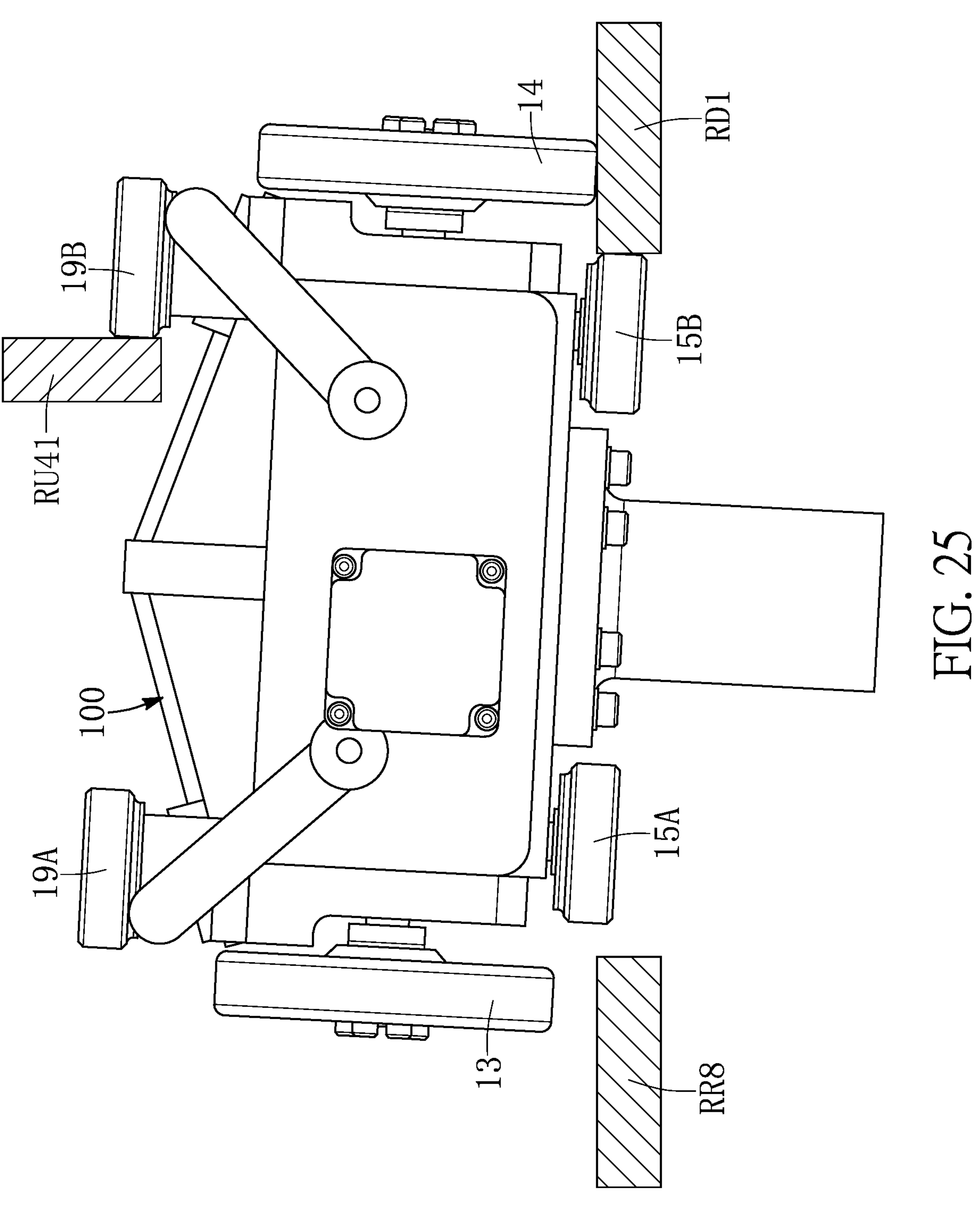
FIG. 25 is a rear view showing the turning of the overhead hoist transfer of the overhead hoist transfer system according to the second embodiment of the present disclosure.

Reference is made to FIG. 22 to FIG. 25. FIG. 22 is a schematic perspective view of the overhead hoist transfer system according to a second embodiment of the present disclosure. FIG. 23 is a schematic cross-sectional view of a fourth upper straight rail and a fourth upper turn rail of a fourth upper rail set of the overhead hoist transfer system according to the second embodiment of the present disclosure. FIG. 24 is a top view showing the straight-moving after turning into a straight rail of the overhead hoist transfer of the overhead hoist transfer system according to the second embodiment of the present disclosure. FIG. 25 is a rear view showing the turning of the overhead hoist transfer of the overhead hoist transfer system according to the second embodiment of the present disclosure.

The first difference between this embodiment and the aforementioned embodiment shown in FIG. 11 is that the predetermined main moving path is turn followed by going straight. The second difference between this embodiment and the aforementioned embodiment shown in FIG. 11 is that one end of the third lower straight rail RD3 opposite to the third lower turn rail RR3 is opposite to a sixth lower straight rail RD6. One end of the sixth lower straight rail RD6 facing the third lower straight rail RD3 is connected to a seventh lower turn rail RR7. One end of the third lower straight rail RD3 facing the sixth lower straight rail RD6 is connected to an eighth lower turn rail RR8. A branching gap is formed between the third lower straight rail RD3 and the sixth lower straight rail RD6.

The third difference between this embodiment and the aforementioned embodiment shown in FIG. 11 is that this embodiment further includes a fourth upper rail set RU4. The fourth upper rail set RU4 includes a fourth upper straight rail RU41 and a fourth upper turn rail RU42. The fourth upper straight rail RU41 is approximately disposed above the first lower straight rail RD1, and the fourth upper turn rail RU42 is approximately disposed above the eighth lower turn rail RR8. A straight distance between a lower edge of the fourth upper straight rail RU41 and a plane E4 where the adjacent first lower straight rail RD1 is located is defined as a seventh height H7. A straight distance between a lower edge of the fourth upper turn rail RU42 and the plane E4 is defined as an eighth height H8. The eighth height H8 is greater than the seventh height H7, and a surface on which the drive wheel moves on the first lower straight rail RD1 is located on a same plane as the plane E4.

As shown in FIG. 24, during the turning of the overhead hoist transfer 100 along the first upper turn rail RU12 of the first upper rail set RU1, the two second upper guide wheels 19B abut against a side surface of the first upper turn rail RU12, the first drive wheel 13 is lifted, and the first drive wheel 13 crosses the first rail gap X1.

As shown in FIG. 24 and FIG. 25, since the predetermined main movement path is turn followed by going straight, after the overhead hoist transfer 100 turns along the first upper rail set RU1, the control module 12 no longer controls the guide wheel moving device 17. In this way, the two first upper guide wheels 19A and the two second upper guide wheels 19B are kept in the lower position. When the overhead hoist transfer 100 moves along the fourth upper rail set RU4, the two second upper guide wheels 19B abut against a side surface of the fourth upper straight rail RU41, the overhead hoist transfer 100 is inclined, and the first drive wheel 13 is not in contact with the third lower straight rail RD3 and the sixth lower straight rail RD6, so that the first drive wheel 13 can cross a third branching gap Z3 accordingly. The third branching gap Z3 is formed between one end of the sixth lower straight rail RD6 connected with the seventh lower turn rail RR7 and one end of the third lower straight rail RD3 connected with the eighth lower turn rail RR8.

As shown in FIG. 24, it should be noted that, in one of the variants of this embodiment, the predetermined main moving path may also be straight then turn. That is, the overhead hoist transfer 100 first passes through the fourth upper rail set RU4, and then turns along the first upper rail set RU1. In this way, the control module 12 controls the two first upper guide wheels 19A and the two second upper guide wheels 19B to move to the lower position before the overhead hoist transfer 100 passes through the fourth upper rail set RU4, and then, the control module 12 does not need to control the two first upper guide wheels 19A and the two second upper guide wheels 19B to change their positions until the overhead hoist transfer 100 completely passing through the fourth upper rail set RU4.

Third Embodiment

Figure 26:
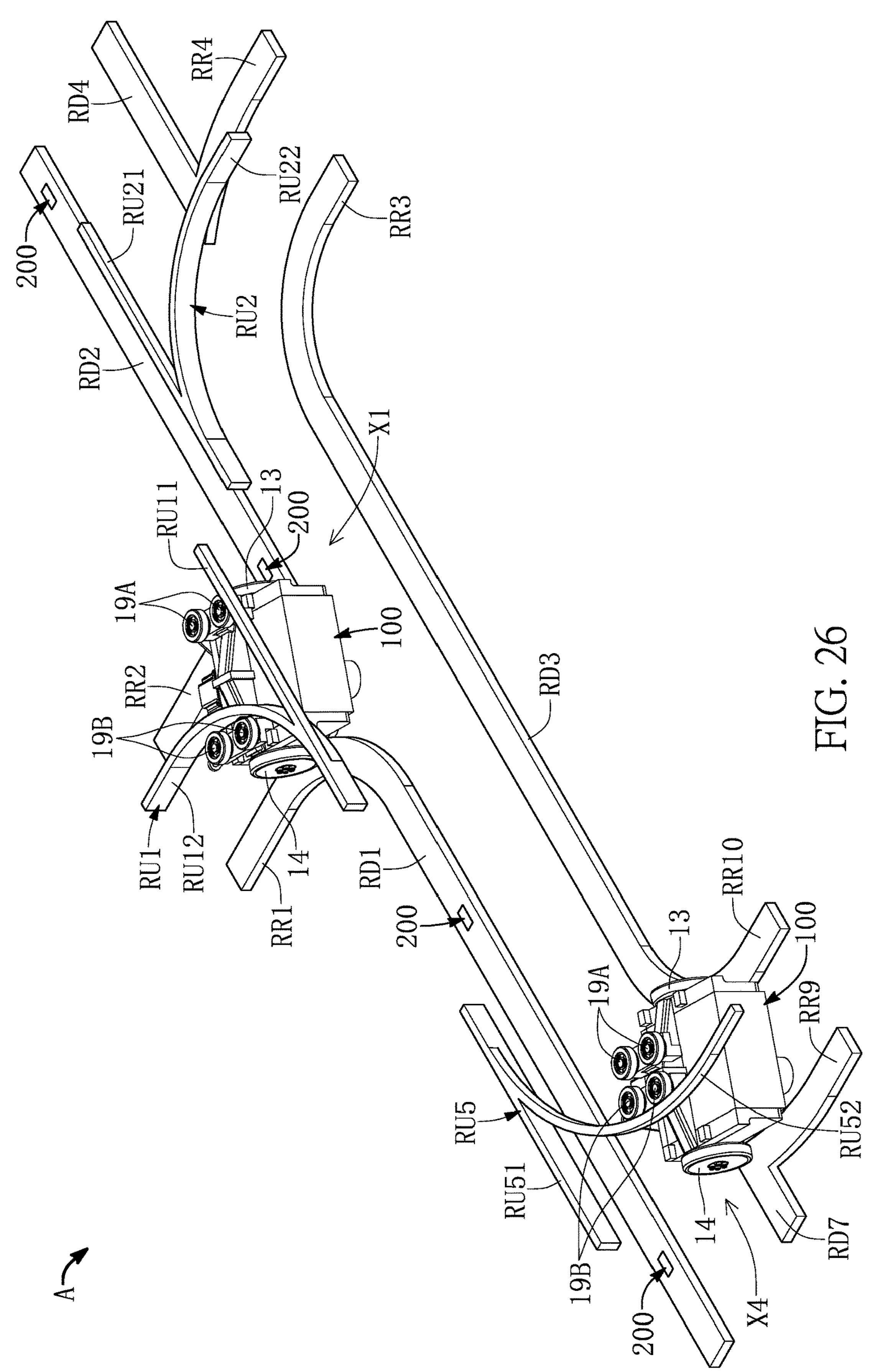
FIG. 26 is a schematic perspective view of the overhead hoist transfer system according to a third embodiment of the present disclosure.
Figure 27:
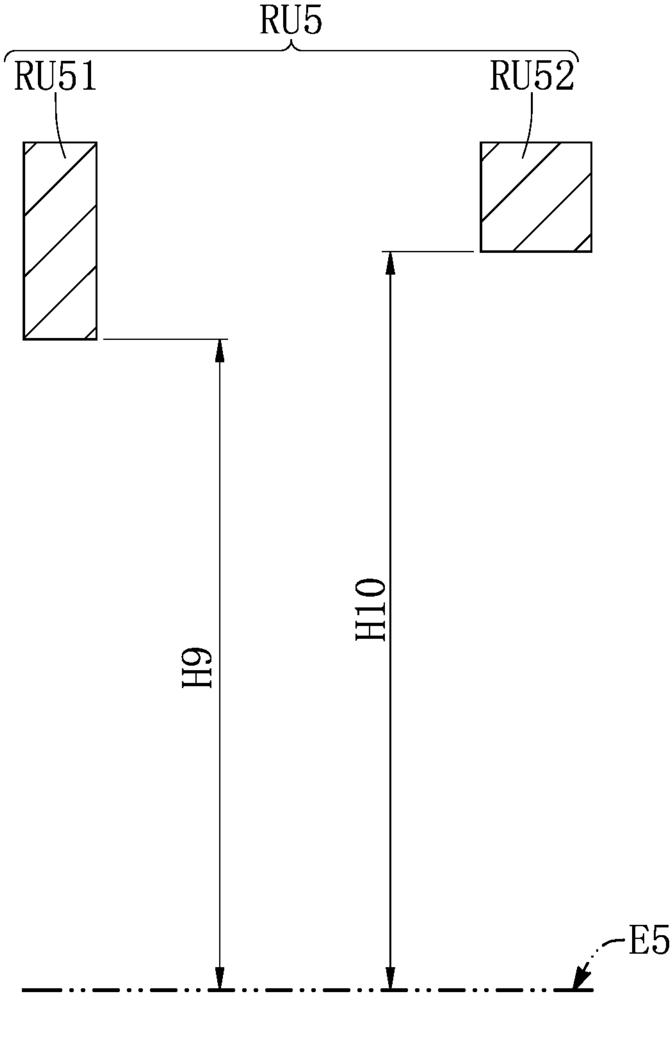
FIG. 27 is a schematic cross-sectional view of a fifth upper straight rail and a fifth upper turn rail of a fifth upper rail set of the overhead hoist transfer system according to the third embodiment of the present disclosure.
Figure 28:
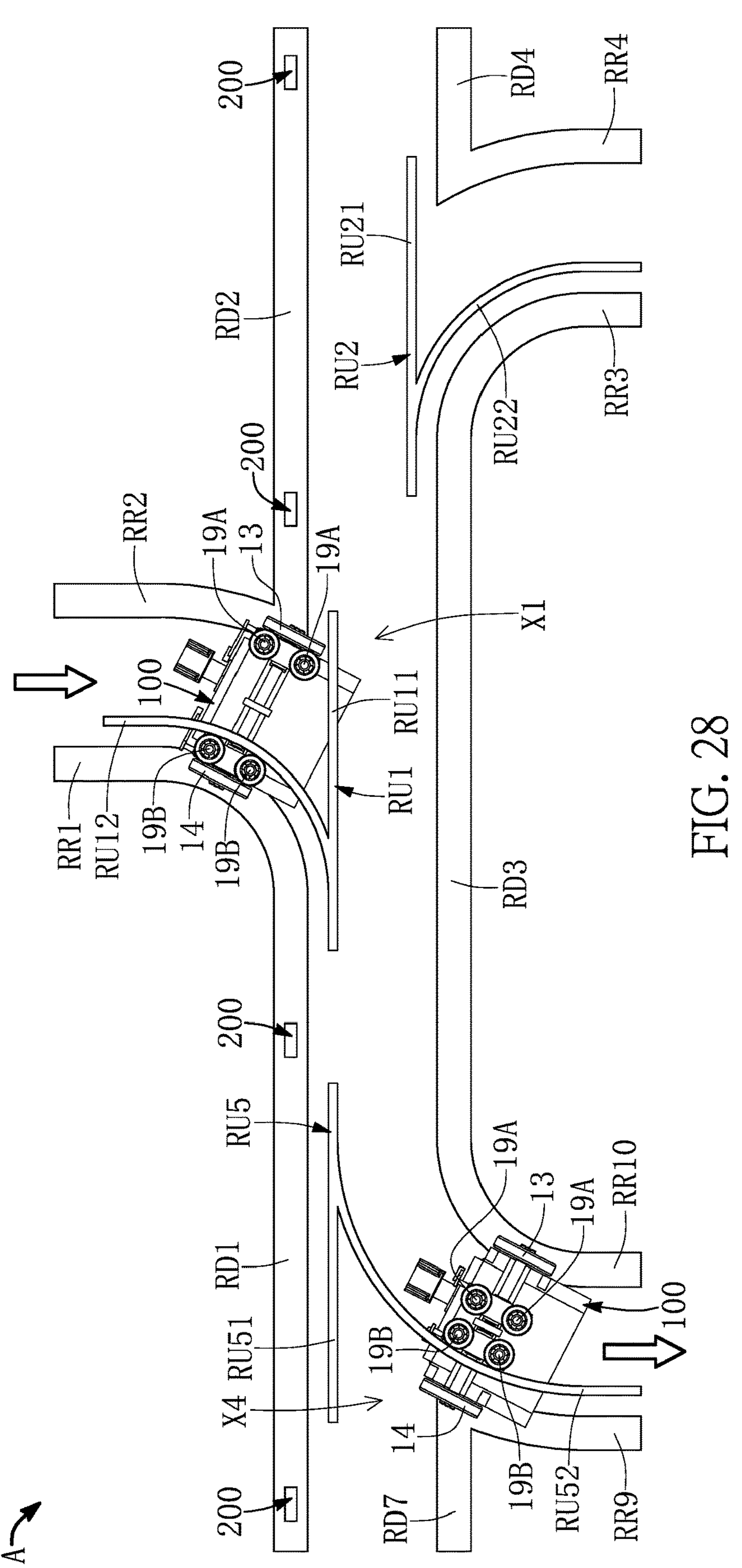
FIG. 28 is a top view of the overhead hoist transfer of the overhead hoist transfer system according to the third embodiment of the present disclosure moving straight after turning into a straight rail and then turning again.
Figure 29:
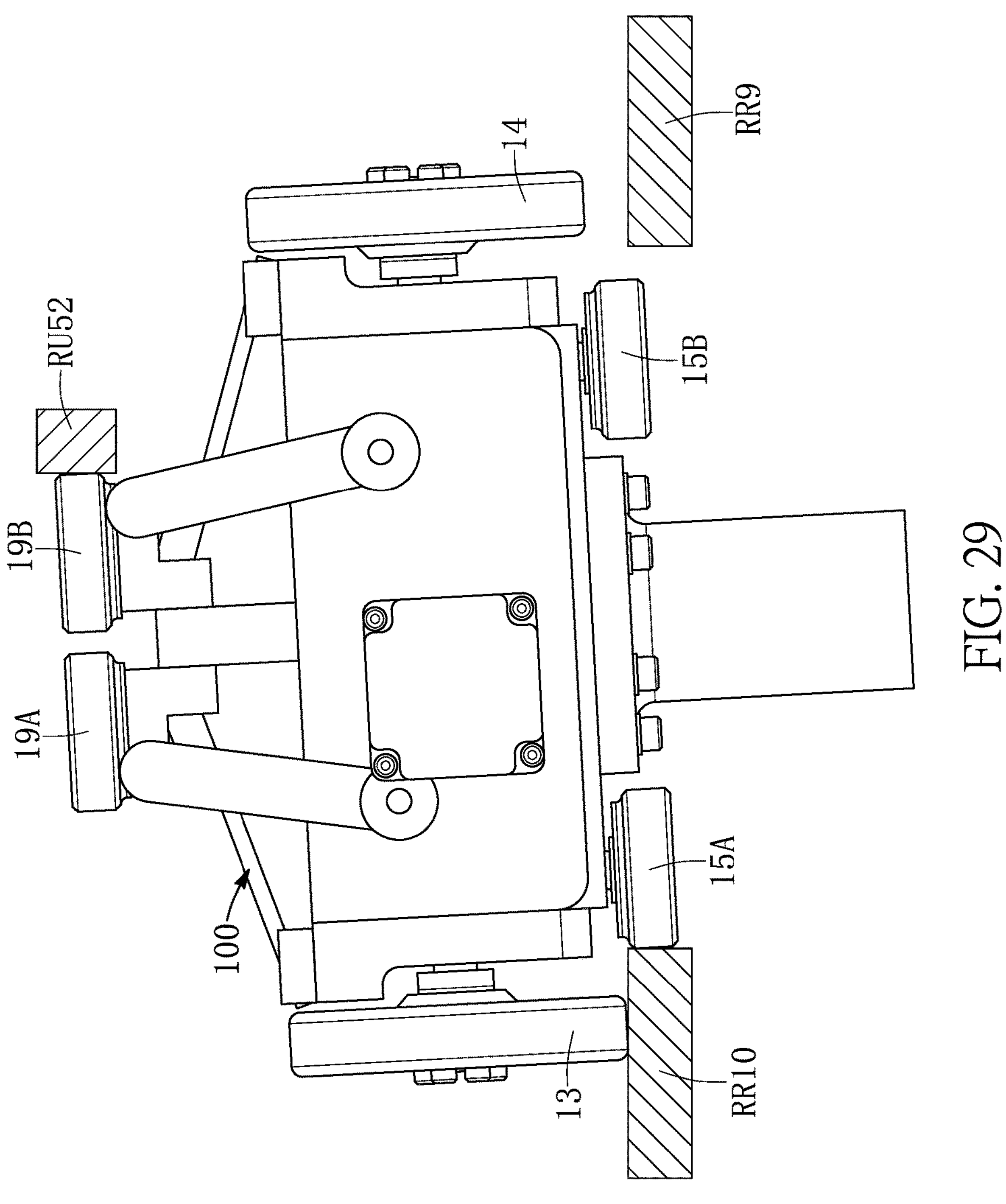
FIG. 29 is a rear view showing the turning of the overhead hoist transfer of the overhead hoist transfer system according to the third embodiment of the present disclosure.

Reference is made to FIG. 26 to FIG. 29. FIG. 26 is a schematic perspective view of the overhead hoist transfer system according to a third embodiment of the present disclosure. FIG. 27 is a schematic cross-sectional view of a fifth upper straight rail and a fifth upper turn rail of a fifth upper rail set of the overhead hoist transfer system according to the third embodiment of the present disclosure. FIG. 28 is a top view of the overhead hoist transfer of the overhead hoist transfer system according to the third embodiment of the present disclosure moving straight after turning into a straight rail and then turning again. FIG. 29 is a rear view showing the turning of the overhead hoist transfer of the overhead hoist transfer system according to the third embodiment of the present disclosure.

The first difference between this embodiment and the aforementioned embodiment shown in FIG. 11 is that the predetermined main moving path is turn then going straight. The second difference between this embodiment and the embodiment shown in FIG. 11 is that one end of the third lower straight rail RD3 opposite to a connection with the third lower turn rail RR3 is facing to a seventh lower straight rail RD7. One end of the seventh lower straight rail RD7 facing the third lower straight rail RD3 is connected to a ninth lower turn rail RR9. One end of the third lower straight rail RD3 facing the seventh lower straight rail RD7 is connected to a tenth lower turn rail RR10. A branching gap is formed between the third lower straight rail RD3 and the seventh lower straight rail RD7.

The third difference between this embodiment and the aforementioned embodiment shown in FIG. 11 is that a fifth upper rail set RU5 is further provided in this embodiment. The fifth upper rail set RU5 includes a fifth upper straight rail RU51 and a fifth upper turn rail RU52. The fifth upper straight rail RU51 is approximately disposed above the first lower straight rail RD1, and the fifth upper turn rail RU52 is approximately disposed above the ninth lower turn rail RR9. A straight distance between a lower edge of the fifth upper straight rail RU51 and a plane E5 where the adjacent first lower straight rail RD1 is located is defined as a ninth height H9. A straight distance between a lower edge of the fifth upper turn rail RU52 and the plane E5 is defined as a tenth height H10. The tenth height H10 is greater than the ninth height H9, and a surface on which the drive wheel moves on the first lower straight rail RD1 is located in a same plane as the plane E5.

As shown in FIG. 28, according to the transfer information, when the control module 12 determines that after the overhead hoist transfer turns along the first upper rail set RU1, the overhead hoist transfer will go straight then turn along the fifth upper rail set RU5, since the overhead hoist transfer 100 does not move along the predetermined main moving path (turn then go straight), after the overhead hoist transfer 100 passes through the first upper rail set RU1 and before entering the fifth upper rail set RU5, the control module 12 controls the two first upper guide wheels 19A and the two second upper guide wheels 19B to move from the lower position to the upper position.

As shown in FIG. 28 and FIG. 29, when the overhead hoist transfer 100 passes through the fifth upper rail set RU5, the two second upper guide wheels 19B at the upper position abut against a side surface of the fifth upper turn rail RU52, the overhead hoist transfer 100 is inclined, and the second drive wheel 14 is suspended. So that the second drive wheel 14 can cross a fourth rail gap X4 between the first lower straight rail RD1 and the fifth lower straight rail RD5. On the contrary, the first drive wheel 13 and the first lower guide wheel 15A move against the tenth lower turn rail RR10.

In contrast, according to the transfer information, when the control module 12 determines that the overhead hoist transfer 100 will go straight through the fifth upper rail set RU5 after passes through the first upper rail set RU1, before the overhead hoist transfer 100 passes through the first upper rail set RU1, the control module 12 controls the two first upper guide wheels 19A and the two second upper guide wheels 19B to be in the lower position, and after that, the control module 12 does not need to control the two first upper guide wheels 19A and the two second upper guide wheels 19B to change their positions until the overhead hoist transfer 100 completely passing through the fifth upper rail set RU5.

Fourth Embodiment

Figure 30:
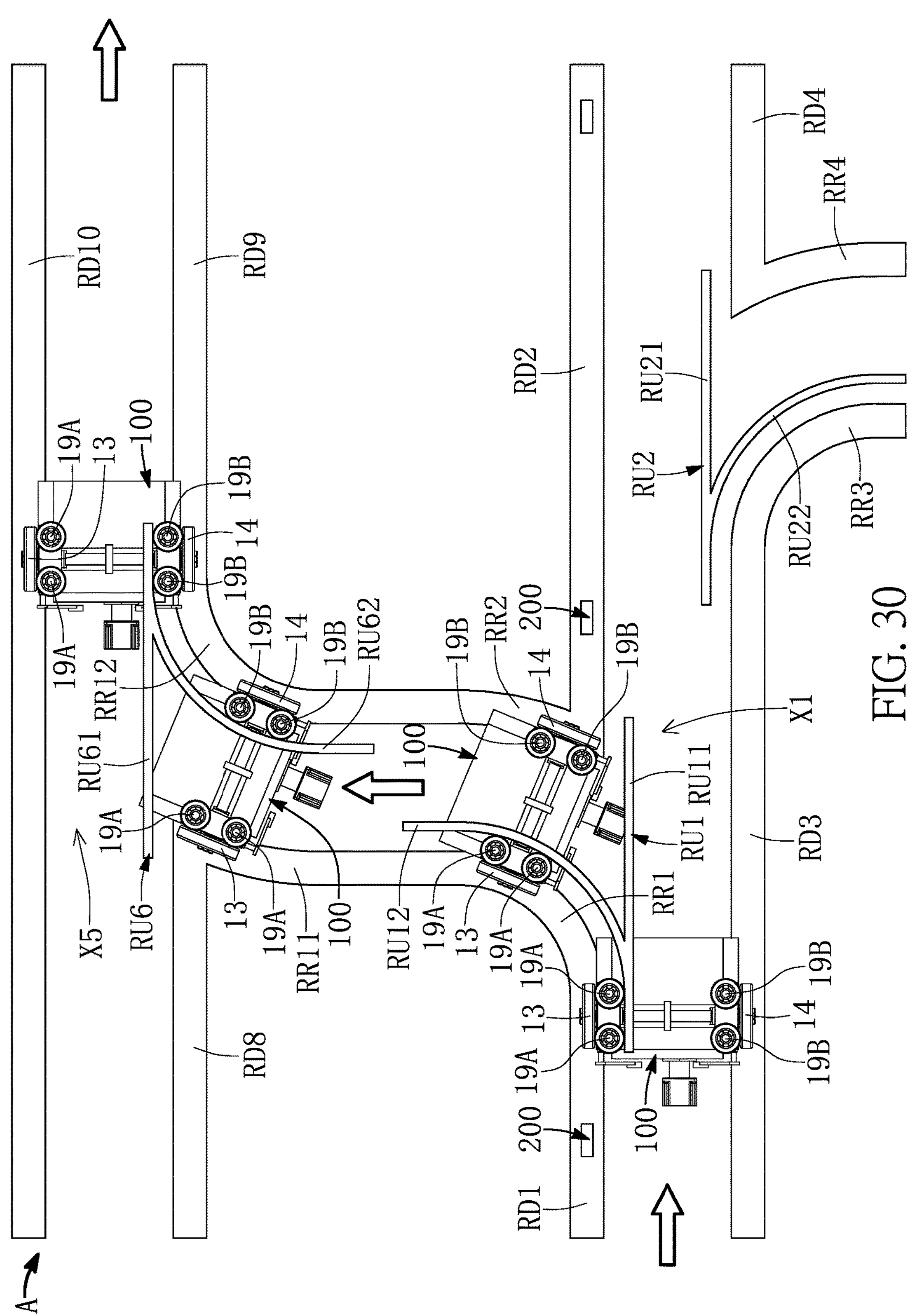
FIG. 30 is a top view of the overhead hoist transfer system according to a fourth embodiment of the present disclosure.
Figure 31:
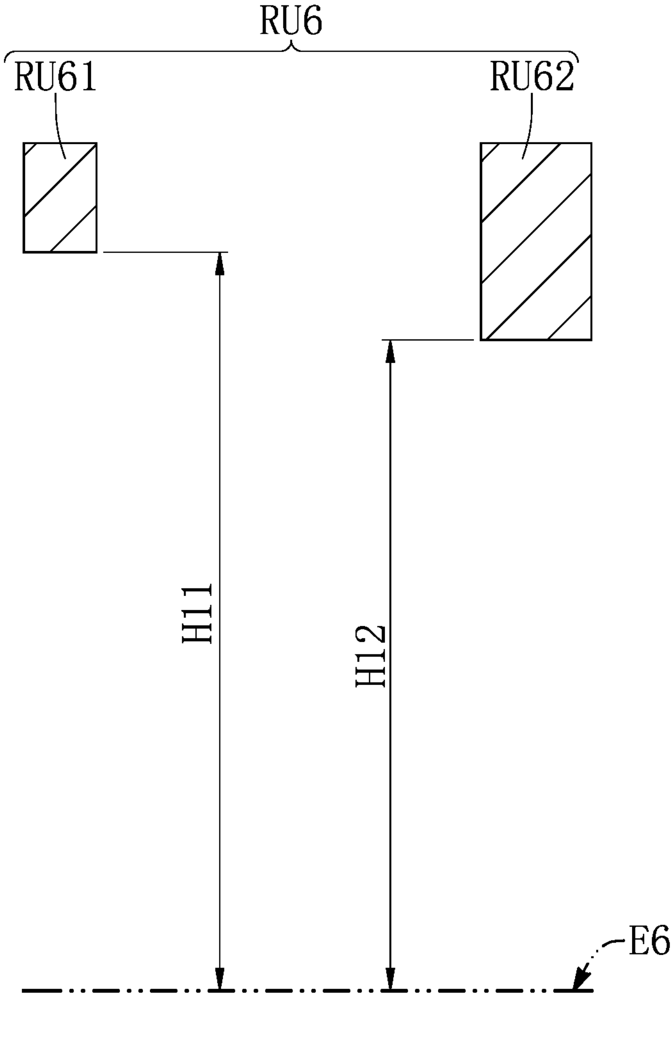
FIG. 31 is a schematic cross-sectional view of a sixth upper straight rail and a sixth upper turn rail of a sixth upper rail set of the overhead hoist transfer system according to the fourth embodiment of the present disclosure.

Reference is made to FIG. 30 and FIG. 31. FIG. 30 is a top view of the overhead hoist transfer system according to a fourth embodiment of the present disclosure. FIG. 31 is a schematic cross-sectional view of a sixth upper straight rail and a sixth upper turn rail of a sixth upper rail set of the overhead hoist transfer system according to the fourth embodiment of the present disclosure. The first difference between this embodiment and the embodiment shown in FIG. 11 is that this embodiment further includes: an eleventh lower turn rail RR11, a twelfth lower turn rail RR12, an eighth lower straight rail RD8, a ninth lower straight rail RD9, a tenth lower straight rail RD10, and a sixth upper rail set RU6.

One end of the first lower turn rail RR1 opposite to a connection with the first lower straight rail RD1 is further connected to an eleventh lower turn rail RR11, and one end of the second lower turn rail RR2 opposite to a connection with the second lower straight rail RD2 is further connected to a twelfth lower turn rail RR12. The other end of the eleventh lower turn rail RR11 is connected to an eighth lower straight rail RD8, and the other end of the twelfth lower turn rail RR12 is connected to a ninth lower straight rail RD9. A part of the tenth lower straight rail RD10 is arranged side by side with the eighth lower straight rail RD8, and a part of the tenth lower straight rail RD10 is arranged side by side with the ninth lower straight rail RD9. A fifth rail gap X5 is formed between the eighth lower straight rail RD8 and the tenth lower straight rail RD10. A branching gap is formed between the eighth lower straight rail RD8 and the ninth lower straight rail RD9.

The sixth upper rail set RU6 includes a sixth upper straight rail RU61 and a sixth upper turn rail RU62. The sixth upper straight rail RU61 is approximately disposed above the eighth lower straight rail RD8 and the ninth lower straight rail RD9, and the sixth upper turn rail RU62 is approximately disposed above the twelfth lower turn rail RR12. A height from a lower edge of the sixth upper straight rail RU61 to a plane E6 where the adjacent ninth lower straight rail RD9 is located is defined as an eleventh height H11. A height from a lower edge of the sixth upper turn rail RU62 to the plane E6 is defined as a twelfth height H12. The eleventh height H11 is greater than the twelfth height H12, and a surface on which the drive wheel moves on the ninth lower straight rail RD9 is on a same plane as the plane E6.

During the turning of the overhead hoist transfer 100 along the sixth upper rail set RU6, the two second upper guide wheels 19B abut against the sixth upper turn rail RU62, the overhead hoist transfer 100 is inclined, and the first drive wheel 13 is not in contact with the eighth lower straight rail RD8 and the tenth lower straight rail RD10, so that the first drive wheel 13 crosses the fifth rail gap X5.

Assuming that the predetermined main moving path is straight, and the moving path of the overhead hoist transfer 100 is straight, followed by continuously turning (turning along the first upper rail set RU1, and then turning along the sixth upper rail set RU6) then straight again, the control module 12 only needs to make the two first upper guide wheels 19A and the two second upper guide wheels 19B in the lower position before the overhead hoist transfer 100 passes through the first upper rail set RU1, and after that, the control module 12 does not need to change the positions of the two first upper guide wheels 19A and the two second upper guide wheels 19B until the overhead hoist transfer 100 completely passing through the sixth upper rail set RU6.

That is, under the condition that the predetermined main moving path is straight, and when the overhead hoist transfer 100 moves straight and continuously turns along the path of FIG. 30, the control module 12 no longer needs to control each of the upper guide wheels for position changing. Since the control module 12 does not need to frequently change the position of each of the upper guide wheels, the overhead hoist transfer 100 can move along the path shown in FIG. 30 effectively.

In the prior art, when the overhead hoist transfer moves along the path like FIG. 30, related control modules should repeatedly control related components to ensure that the overhead hoist transfer can continuously pass through two turns successfully, causing the overhead hoist transfer needs to move at a relatively low speed, and reducing the transfer efficiency of overhead hoist transfers.

In summary, the overhead hoist transfer system and the overhead hoist transfer provided by the present disclosure allow professional personnel to plan a predetermined main movement path according to the requirements of the factory through the aforementioned lower straight rail, lower turn rail, upper rail set, moving kit, etc. So that, when moving along the main moving path, the overhead hoist transfer can pass through the rails at a relatively high speed compared to the prior art, thereby improving the transferring efficiency.

The description and drawings of the above-mentioned embodiments depict an example that one end of the upper straight rail and one end of the upper turn rail of the above rail set are mutually connected. However, the upper straight rail and upper turn rail of the upper rail set can also be independent. i.e., the upper straight rail and the upper turn rail can be independently hung at the position close to the ceiling of the factory by hanging brackets.

Besides, as described in the foregoing embodiments, the overhead hoist transfer mainly makes the overhead hoist transfer move straight or turn through the cooperation of the upper guide wheel and the upper straight rail or the upper turn rail of the upper rail set. So, the relative positions of the upper straight rail and the upper turn rail of each of the upper rail set and the adjacent lower straight rail and the lower turn rail can be designed and adjusted according to actual requirements.

It should be noted that each of the above-mentioned lower turn rails refers to a rail section that includes at least one segment that is curved, i.e., in some cases, a lower turn rail can also include a partially straight rail section. However, each of the above-mentioned lower straight rails refers to a straight rail. In addition, in practice, the planes E1 to E6 may be located on a same horizontal plane.

Fifth Embodiment

Figure 32:
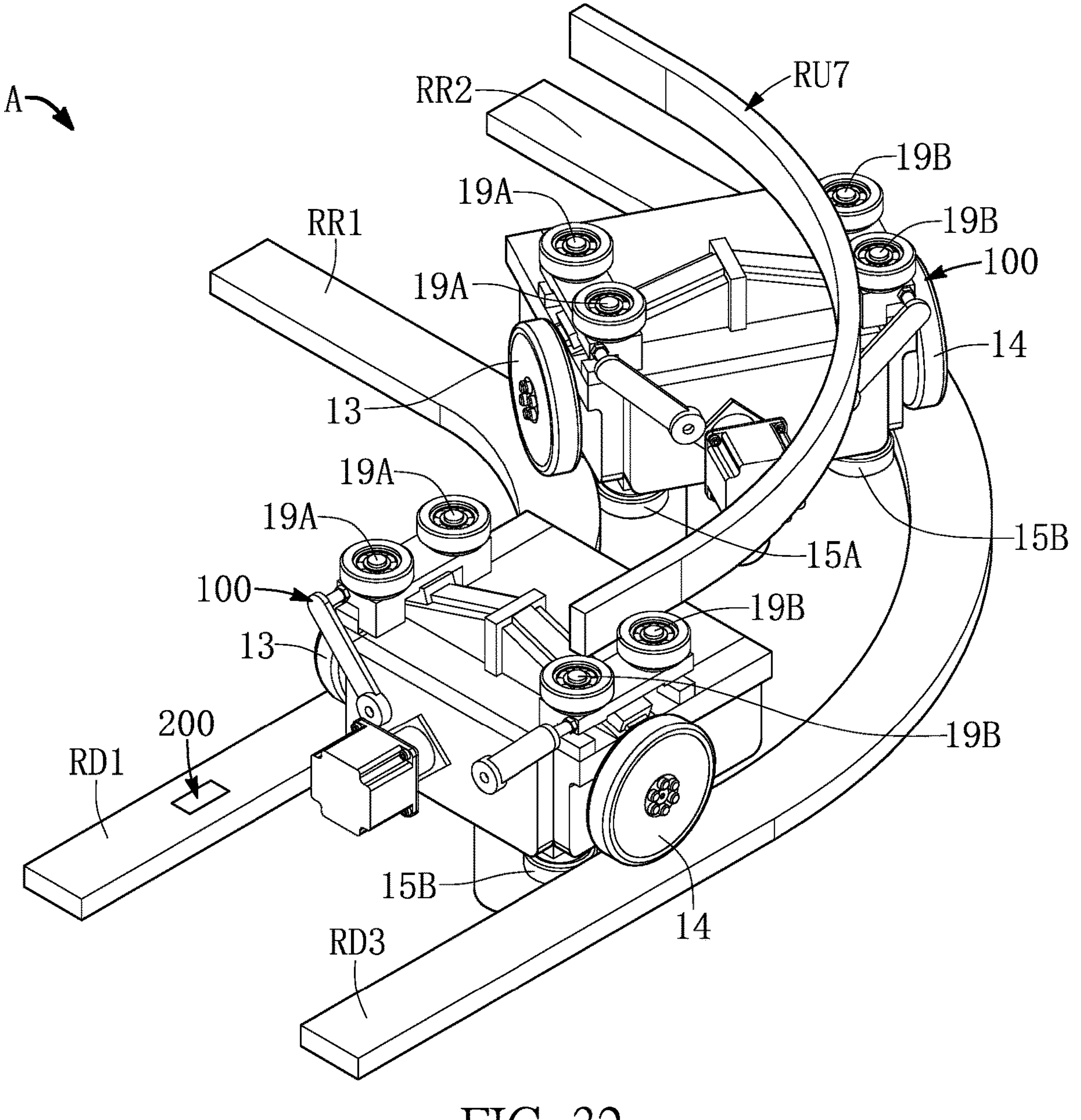
FIG. 32 and FIG. 33 are respectively perspective view and top view of the overhead hoist transfer system according to a fifth embodiment of the present disclosure.
Figure 33:
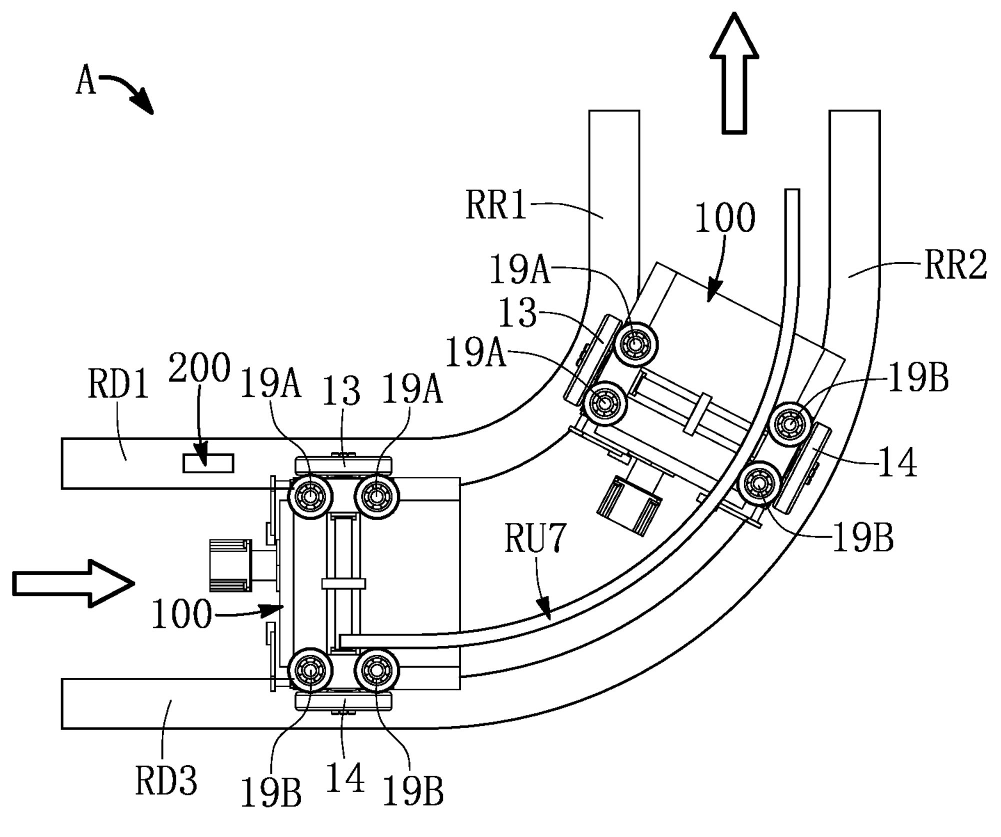

Reference is made to FIG. 32 and FIG. 33, which are perspective view and top view of the overhead hoist transfer system according to a fifth embodiment of the present disclosure. The main difference between this embodiment and the embodiment shown in FIG. 15 is that there is no first upper rail set RU1 disposed above a position adjacent to the first lower turn rail RR1. However, an auxiliary upper turn rail RU7 is disposed above a position adjacent to the second lower turn rail RR2, and the second lower turn rail RR2 is connected to the third lower straight rail RD3.

When the two second upper guide wheels 19B of the overhead hoist transfer 100 are located at the lower position and abut against the auxiliary upper turn rail RU7, the overhead hoist transfer 100 is inclined (same posture as the moving kit 1 shown in FIG. 25), and the first drive wheel 13 of the overhead hoist transfer 100 is lifted, so that the first drive wheel 13 does not contact the first lower straight rail RD1 and the first lower turn rail RR1 until the two second upper guide wheels 19B no longer abutting against the auxiliary upper turn rail RU7.

According to the above description, through the auxiliary upper turn rail RU7, during the turning of the overhead hoist transfer 100, the second drive wheel 14 and the second lower guide wheel 15B abut against the third lower straight rail RD3 and the second lower turn rail RR2, and the first drive wheel 13 and the first lower guide wheel 15A do not abut against the first lower straight rail RD1 and the first lower turn rail RR1. Therefore, the overhead hoist transfer 100 can make a turn at a relatively high speed.

Sixth Embodiment

Figure 34:
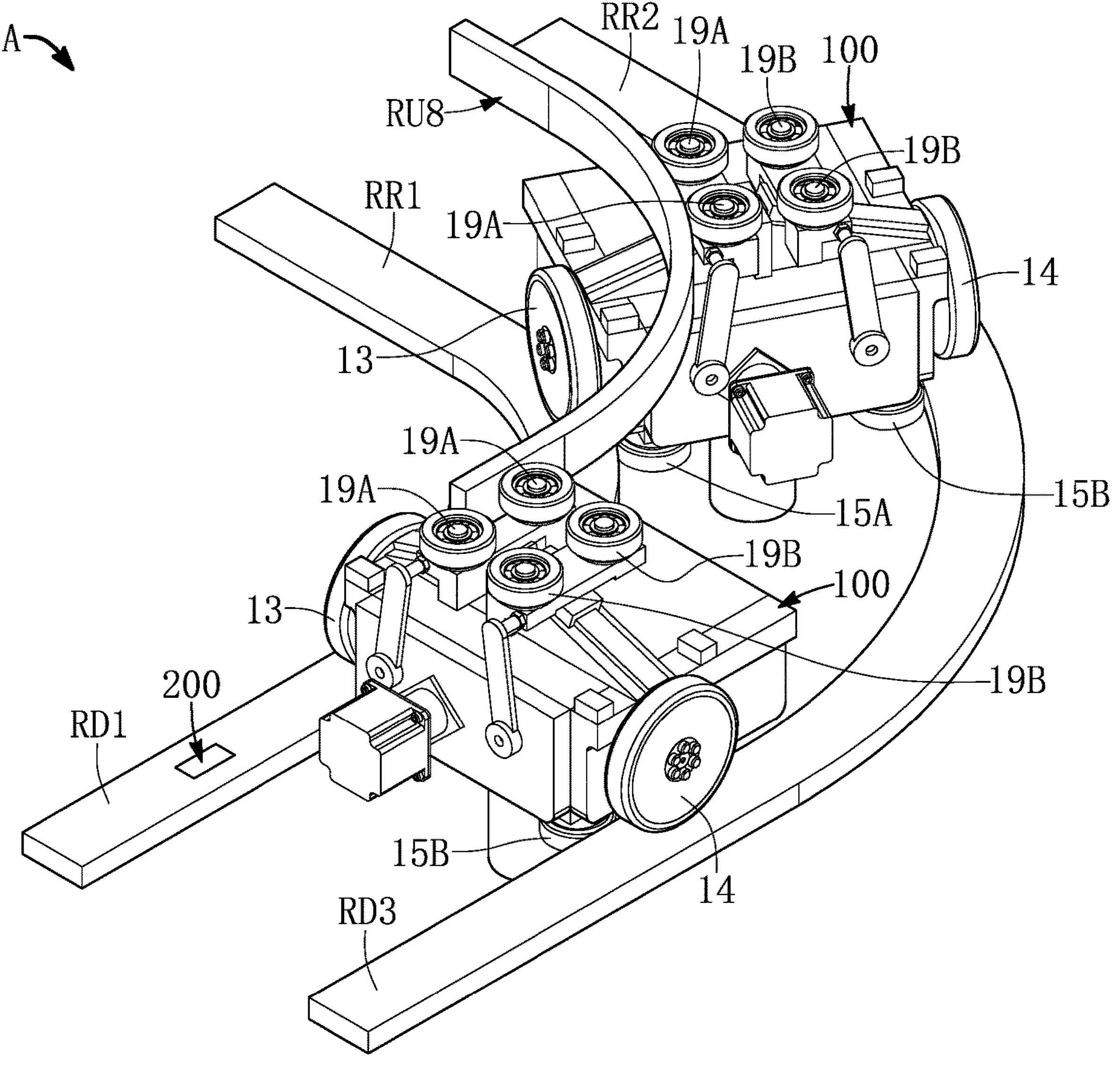
FIG. 34 and FIG. 35 are respectively perspective view and top view of the overhead hoist transfer system according to a sixth embodiment of the present disclosure.
Figure 35:
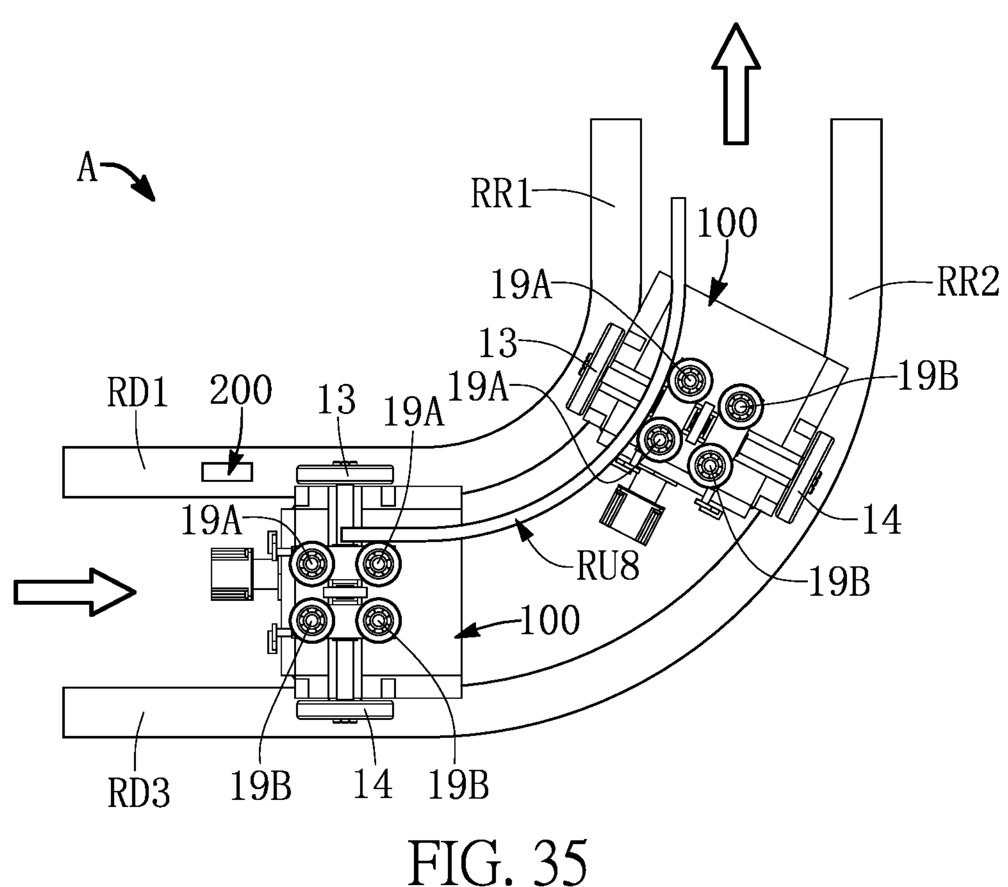

Reference is made to FIG. 34 and FIG. 35, which are perspective view and top view of the overhead hoist transfer system according to a sixth embodiment of the present disclosure. The main difference between this embodiment and the aforementioned fifth embodiment is that an auxiliary upper turn rail RU8 is disposed above a position adjacent to the first lower turn rail RR1, and during the turning of the overhead hoist transfer 100 along the auxiliary upper turn rail RU8, the third lower straight rail RD3, and the second lower turn rail RR2, the two first upper guide wheels 19A are in the upper position, and the overhead hoist transfer 100 is inclined (same posture as the moving kit 1 shown in FIG. 12), and the first drive wheel 13 of overhead hoist transfer 100 is lifted, so that the first drive wheel 13 is not contacted with the first lower straight rail RD1 and the first lower turn rail RR1 until the two first upper guide wheels 19A no longer abutting against the auxiliary upper turn rail RU8.

It should be noted that the overhead hoist transfer and the moving kit in the overhead hoist transfer system described in the present disclosure can be manufactured, implemented, and sold separately, and the overhead hoist transfer described in the present disclosure is not limited that the lower straight rail, the lower turn rail, and the upper rail set must be manufactured, implemented or sold together.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An overhead hoist transfer system, comprising:

a plurality of lower straight rails installed in a position close to a ceiling in a factory, wherein the plurality of lower straight rails are disposed side by side, a first lower straight rail and a second lower straight rail of the plurality of lower straight rails are on a same side, an end of the first lower straight rail and an end of the second lower straight rail are disposed at an interval to form a branching gap, the end of the first lower straight rail and the end of the second lower straight rail forming the branching gap are respectively connected to a lower turn rail, and the plurality of lower straight rails form one or more of the branching gaps;

a plurality of upper rail sets, each of the upper rail sets including an upper straight rail and an upper turn rail, wherein each of the upper rail sets is adjacent to one of the branching gaps, and the upper turn rail is disposed above the lower turn rail connected to one of the lower straight rails that forms the branching gap; and at least one overhead hoist transfer, including:

a frame for carrying a to-be-transferred object; and at least one moving kit disposed on the frame, and the moving kit including:

a control module;

at least one body;

at least two drive wheel sets respectively disposed on two opposite sides of the body, wherein each of the drive wheel sets is adjacent to a lower end of the body, each of the drive wheel sets includes at least one drive wheel, and the control module controls each of the drive wheel sets to allow the at least one drive wheel of each of the drive wheel sets to move on the lower straight rail;

two switching modules electrically connected to the control module; and at least two upper guide wheels, each of the upper guide wheels connected to one of the switching modules and disposed at an upper end of the body, wherein each of the upper guide wheels abuts against the upper turn rail or the upper straight rail, and the control module controls each of the switching modules to allow the corresponding upper guide wheel to move toward or away from the body along an inclined path relative to the body; and wherein the control module receives transfer information, and when the control module determines that the overhead hoist transfer is about to pass the upper rail set according to the transfer information, the control module controls at least one of the switching modules to allow the corresponding upper guide wheel to move toward or away from the body along the inclined path;

wherein a distance between a lower edge of the upper straight rail included in one of the upper rail sets and a plane where the lower straight rail is located is not equal to a distance between a lower edge of the upper turn rail included in the one of the upper rail sets and the plane.

2. The overhead hoist transfer system according to claim 1, wherein the control module controls each of the switching modules to allow the corresponding upper guide wheel to move along the inclined path between a lower position close to the body and an upper position away from the body;

wherein, when one of the upper guide wheels at the upper position or the lower position abuts against one of the upper turn rails or one of the upper straight rails, the body is inclined, and one of the drive wheels is not in contact with the adjacent lower straight rail or the adjacent lower turn rail.

3. The overhead hoist transfer system according to claim 2, wherein the control module controls at least one of the switching modules to allow at least one of the corresponding upper guide wheels moving to the upper position or the lower position before the overhead hoist transfer passes through the upper rail set according to the transfer information;

wherein the moving kit further includes at least two lower guide wheels, one of the lower guide wheels is adjacent to one of the drive wheels and the other one of the lower guide wheels is adjacent to the other one of the drive wheels;

wherein, during a process of the overhead hoist transfer passing through the upper rail set, the drive wheel that are not in contact with the adjacent lower straight rail or the lower turn rail is able to cross the branching gap or a rail gap;

wherein the rail gap is formed by two of the lower straight rails arranged side by side, or is formed by one of the lower straight rails and one of the lower turn rails; and wherein, during the process of the overhead hoist transfer passing through the upper rail set, one of the drive wheels and the adjacent lower guide wheel are not in contact with the adjacent lower straight rail or the lower turn rail, and the other one of the drive wheels and the adjacent lower guide wheel are in contact with the adjacent lower straight rail or the lower turn rail.

4. The overhead hoist transfer system according to claim 3, wherein, when the control module determines that the overhead hoist transfer is about to move along a predetermined main moving path according to the transfer information, the control module controls at least one of the switching modules to allow at least one of the corresponding upper guide wheels to be in the upper position or the lower position before the overhead hoist transfer moves along the predetermined main moving path, and the control module no longer controls the switching module to operate during a movement of the overhead hoist transfer along the predetermined main moving path; and wherein, during the movement of the overhead hoist transfer along the predetermined main moving path, the overhead hoist transfer passes through one or more of the branching gaps and at least one of the upper rail sets.

5. The overhead hoist transfer system according to claim 4, wherein the predetermined main moving path is straight, turning then straight, or straight then turning;

wherein, when the predetermined main moving path is straight, the control module does not control any of the upper guide wheels for position changing during a process of continuous turning of the overhead hoist transfer; and wherein, when the predetermined main moving path is straight, the control module controls at least one of the upper guide wheels for position changing before the overhead hoist transfer turns along the upper rail set.

6. The overhead hoist transfer system according to claim 1, wherein the moving kit further includes a guide wheel moving device, the guide wheel moving device includes a drive unit and two linkage components, the guide wheel moving device is disposed on the body, the drive unit is electrically connected to the control module, each of the linkage components has one end connected to the drive unit and the other one end connected to one of the switching modules; and wherein the control module controls the drive unit to drive two of the switching modules through the two linkage components, allowing each of the upper guide wheels moving toward or away from the body along the inclined path.

7. The overhead hoist transfer system according to claim 1, wherein the overhead hoist transfer system further includes a plurality of identification units, each of the identification units is disposed at one of the lower straight rails, or each of the identification units is adjacent to one of the lower straight rails;

wherein the overhead hoist transfer further includes a sensor, the sensor senses the adjacent identification unit, and generates position information accordingly; and wherein the control module determines whether or not to control at least one of the switching modules to change a current position before the overhead hoist transfer passes through the upper rail set according to the transfer information and the position information.

8. The overhead hoist transfer system according to claim 1, wherein each of the switching modules includes two inclined guide rails, at least one upper stop member, and at least one lower stop member, a slider is disposed on each of the inclined guide rails, each slider is connected to at least one of the upper guide wheel, and the upper guide wheel moves along with the slider on the inclined guide rail so as to move between an upper position away from the body and a lower position close to the body along the inclined path;

wherein the moving kit further includes at least two lower guide wheels, one of the lower guide wheels is adjacent to one of the drive wheels, and the other one of the lower guide wheels is adjacent to the other one of the drive wheels;

wherein, when one of the upper guide wheels abuts against the upper turn rail or the upper straight rail and the corresponding slider abuts against the adjacent upper stop member or the lower stop member, the body is inclined, one of the drive wheels and the adjacent lower guide wheel are not in contact with the adjacent lower straight rail or the lower turn rail, and the other one of the drive wheels and the adjacent lower guide wheel are in contact with the adjacent lower straight rail or the lower turn rail.

9. The overhead hoist transfer system according to claim 1, wherein an auxiliary upper turn rail is disposed above at least one of the lower turn rails; and wherein, when one of the upper guide wheels located at the upper position or the lower position abuts against the auxiliary upper turn rail, the body is inclined.

10. An overhead hoist transfer applicable for an overhead hoist transfer system, the overhead hoist transfer system including a plurality of lower straight rails and a plurality of upper rail sets, wherein the plurality of lower straight rails are installed in a position close to a ceiling in a factory, the plurality of lower straight rails are disposed side by side, a first lower straight rail and a second lower straight rail of the plurality of lower straight rails are on a same side, and an end of the first lower straight rail and an end of the second lower straight rail are disposed at an interval to form a branching gap, the end of the first lower straight rail and the end of the second lower straight rail forming the branching gap are respectively connected to a lower turn rail, the plurality of lower straight rails form one or more of the branching gaps, each of the upper rail sets includes an upper straight rail and an upper turn rail, each of the upper rail sets is adjacent to one of the branching gaps, and the upper turn rail is disposed above the lower turn rail connected to one of the lower straight rails that forms the branching gap; the overhead hoist transfer comprising:

a frame for carrying a to-be-transferred object; and at least one moving kit disposed on the frame, and the moving kit including:

a control module;

at least one body;

at least two drive wheel sets respectively disposed on two opposite sides of the body, wherein each of the drive wheel sets is adjacent to a lower end of the body, each of the drive wheel sets includes at least one drive wheel, and the control module controls each of the drive wheel sets to allow each of the drive wheels to move on the lower straight rail;

two switching modules electrically connected to the control module; and at least two upper guide wheels, each of the upper guide wheels connected to one of the switching modules and disposed at an upper end of the body, wherein each of the upper guide wheels abuts against the upper turn rail or the upper straight rail, and the control module controls each of the switching modules to allow the corresponding upper guide wheel to move toward or away from the body along an inclined path relative to the body; and wherein the control module receives transfer information, and when the control module determines that the overhead hoist transfer is about to pass through the upper rail set according to the transfer information, the control module controls at least one of the switching modules to allow the corresponding upper guide wheel to move toward or away from the body along the inclined path;

wherein a distance between a lower edge of the upper straight rail included in one of the upper rail sets and a plane where the lower straight rail is located is not equal to a distance between a lower edge of the upper turn rail included in the one of the upper rail sets and the plane.

11. The overhead hoist transfer according to claim 10, wherein the control module controls each of the switching modules to allow the corresponding upper guide wheel to move along the inclined path between a lower position close to the body and an upper position away from the body, and when one of the upper guide wheels at the upper position or the lower position abuts against one of the upper turn rails or one of the upper straight rails, the body is inclined, and one of the drive wheels is not in contact with the adjacent lower straight rail or the adjacent lower turn rail.

12. The overhead hoist transfer according to claim 11, wherein the control module controls at least one of the switching modules to allow at least one of the corresponding upper guide wheels moving to the upper position or the lower position before the overhead hoist transfer passes through the upper rail set according to the transfer information, the moving kit further includes at least two lower guide wheels, one of the lower guide wheels is adjacent to one of the drive wheels and the other one of the lower guide wheels is adjacent to the other one of the drive wheels, during a process of the overhead hoist transfer passing through the upper rail set, the drive wheel that are not in contact with the adjacent lower straight rail or the lower turn rail is able to cross the branching gap or a rail gap, the rail gap is formed by two of the lower straight rails arranged side by side, or is formed by one of the lower straight rails and one of the lower turn rails, and during the process of the overhead hoist transfer passing through the upper rail set, one of the drive wheels and the adjacent lower guide wheel are not in contact with the adjacent lower straight rail or the lower turn rail, and the other one of the drive wheels and the adjacent lower guide wheel are in contact with the adjacent lower straight rail or the lower turn rail.

13. The overhead hoist transfer according to claim 12, wherein, when the control module determines that the overhead hoist transfer is about to move along a predetermined main moving path according to the transfer information, the control module controls at least one of the switching modules to allow at least one of the corresponding upper guide wheels to be in the upper position or the lower position before the overhead hoist transfer moves along the predetermined main moving path, and the control module no longer controls the switching module to operate during a movement of the overhead hoist transfer along the predetermined main moving path, and during the movement of the overhead hoist transfer along the predetermined main moving path, the overhead hoist transfer passes through one or more of the branching gaps and at least one of the upper rail sets.

14. The overhead hoist transfer according to claim 13, wherein the predetermined main moving path is straight, turning then straight, or straight then turning; wherein, when the predetermined main moving path is straight, the control module does not control any of the upper guide wheels for position changing during a process of the continuous turning of the overhead hoist transfer, and when the predetermined main moving path is straight, the control module controls at least one of the upper guide wheels for position changing before the overhead hoist transfer turns along the upper rail set.

15. The overhead hoist transfer according to claim 10, wherein the moving kit further includes a guide wheel moving device, the guide wheel moving device includes a drive unit and two linkage components, the guide wheel moving device is disposed on the body, the drive unit is electrically connected to the control module, each of the linkage components has one end connected to the drive unit and the other one end connected to one of the switching modules, and the control module controls the drive unit to drive two of the switching modules through the two linkage components, allowing each of the upper guide wheels moving toward or away from the body along the inclined path.

16. The overhead hoist transfer according to claim 10, wherein the overhead hoist transfer further includes a sensor, the sensor senses one of a plurality of identification units adjacent thereto, and generates position information accordingly, the control module determines whether or not to control at least one of the switching modules to change a current position before the overhead hoist transfer passes through the upper rail set according to the transfer information and the position information, the overhead hoist transfer system further includes the plurality of identification units, each of the identification units is disposed at one of the lower straight rails, or each of the identification units is adjacent to one of the lower straight rails.

17. The overhead hoist transfer according to claim 10, wherein each of the switching modules includes two inclined guide rails, at least one upper stop member, and at least one lower stop member, a slider is disposed on each of the inclined guide rails, each slider is connected to at least one of the upper guide wheel, and the upper guide wheel moves along with the slider on the inclined guide rail so as to move between an upper position away from the body and a lower position close to the body along the inclined path; wherein the moving kit further includes at least two lower guide wheels, one of the lower guide wheels is adjacent to one of the drive wheels, and the other one of the lower guide wheels is adjacent to the other one of the drive wheels, when one of the upper guide wheels abuts against the upper turn rail or the upper straight rail and the corresponding slider abuts against the adjacent upper stop member or the lower stop member, the body is inclined, one of the drive wheels and the adjacent lower guide wheel are not in contact with the adjacent lower straight rail or the lower turn rail, and the other one of the drive wheels and the adjacent lower guide wheel are in contact with the adjacent lower straight rail or the lower turn rail.

18. A moving kit disposed on a frame of an overhead hoist transfer, wherein the frame is used to carry a to-be-transferred object, and the overhead hoist transfer moves along a plurality of lower straight rails and a plurality of upper rail sets of an overhead hoist transfer system through the moving kit, the plurality of lower straight rails are installed in a position close to a ceiling in a factory, the plurality of lower straight rails are disposed side by side, a first lower straight rail and a second lower straight rail of the plurality of lower straight rails are on a same side, an end of the first lower straight rail and an end of the second lower straight rail are disposed at an interval to form a branching gap, the end of the first lower straight rail and the end of the second lower straight rail forming the branching gap are respectively connected to a lower turn rail, and the plurality of lower straight rails form one or more of the branching gaps, each of the upper rail sets includes an upper straight rail and an upper turn rail, each of the upper rail sets is adjacent to one of the branching gaps, and the upper turn rail is disposed above the lower turn rail connected to one of the lower straight rails that forms the branching gap; the moving kit comprising:

a control module;

at least one body;

at least two drive wheel sets respectively disposed on two opposite sides of the body, wherein each of the drive wheel sets is adjacent to a lower end of the body, each of the drive wheel sets includes at least one drive wheel, the control module controls each of the drive wheel sets to allow each of the drive wheels to move on the lower straight rail;

two switching modules electrically connected to the control module; and at least two upper guide wheels, each of the upper guide wheels connected to one of the switching modules and disposed at an upper end of the body, wherein each of the upper guide wheels abuts against the upper turn rail or the upper straight rail, and the control module controls each of the switching modules to allow the corresponding upper guide wheel to move toward or away from the body along an inclined path relative to the body; and wherein the control module receives transfer information, and when the control module determines that the overhead hoist transfer is about to pass the upper rail set according to the transfer information, the control module controls at least one of the switching modules to allow the corresponding upper guide wheel to move toward or away from the body along the inclined path;

wherein a distance between a lower edge of the upper straight rail included in one of the upper rail sets and a plane where the lower straight rail is located is not equal to a distance between a lower edge of the upper turn rail included in the one of the upper rail sets and the plane.

19. The moving kit according to claim 18, wherein the moving kit further includes at least two lower guide wheels, one of the lower guide wheels is adjacent to one of the drive wheels, and the other one of the lower guide wheels is adjacent to the other one of the drive wheels, during a process of the overhead hoist transfer passing through the upper rail set, one of the drive wheels and the adjacent lower guide wheel are not in contact with the adjacent lower straight rail or the lower turn rail, and the other one of the drive wheels and the adjacent lower guide wheel are in contact with the adjacent lower straight rail or the lower turn rail.

* * * * *